United States Patent [19]

Lagree

[11] Patent Number: 5,006,777
[45] Date of Patent: Apr. 9, 1991

[54] AC INPUT SYSTEM FOR COMPUTER-BASED CONTROL SYSTEM

[75] Inventor: James L. Lagree, Plum Borough, Pa.

[73] Assignee: Westinghouse Electric Corp., Pittsburgh, Pa.

[21] Appl. No.: 43,573

[22] Filed: Apr. 27, 1987

[51] Int. Cl.$^5$ .............................................. H02P 3/18
[52] U.S. Cl. .................................. 318/798; 307/234; 318/806; 328/111
[58] Field of Search ................ 328/111, 112; 307/234; 318/563, 798, 806; 364/184, 186

[56] References Cited

U.S. PATENT DOCUMENTS

| | | | |
|---|---|---|---|
| 3,646,453 | 2/1972 | Garcia | 328/118 |
| 3,735,271 | 5/1973 | Leibowitz | 328/112 |
| 3,790,881 | 2/1974 | Smith | 328/111 |
| 3,828,258 | 8/1974 | Hills et al. | 328/111 |
| 3,942,037 | 3/1976 | Mensch, Jr. | 307/232 |
| 3,961,203 | 6/1976 | Hutch | 307/236 |
| 4,179,625 | 12/1979 | Carter | 307/234 |
| 4,233,525 | 11/1980 | Takahashi et al. | 328/112 |
| 4,353,032 | 10/1982 | Taylor | 328/165 |
| 4,375,036 | 2/1983 | Miller et al. | 307/247 A |
| 4,399,412 | 8/1983 | Rinaldi | 328/112 |
| 4,409,635 | 10/1983 | Kraus | 361/62 |
| 4,456,867 | 6/1984 | Mallick, Jr. | 318/778 |
| 4,525,635 | 6/1985 | Gillberg | 307/247 A |
| 4,692,710 | 9/1987 | Shvartsman | 328/111 |

*Primary Examiner*—David Smith, Jr.
*Attorney, Agent, or Firm*—C. M. Lorin

[57] ABSTRACT

In a computer-based motor drive, a microcomputer is responsive to a plurality of input signals drived from the motor AC lines whenever contacts, or pushbuttons, commanding specific control operations to be performed, are closed. In such case, opto-couplers convert such AC voltage into a square pulse train which conveys a succession of digital high and low levels. A reference signal is derived, through an opto-coupler form the AC line, which in its high and low logic form is delayed in relation to the input signal trains. By sampling the input signal upon the occurrence fo a falling edge of the reference signal, then at least after the delay existing between the signals, the validity of the input signal is tested by comparing the two successive samples, thereby insuring a true command addressed to the microcomputer.

5 Claims, 11 Drawing Sheets

AC INPUT SYSTEM FOR COMPUTER-BASED CONTROL SYSTEM

The present invention relates to computer-based control systems in general, and in particular to an input system for such control system wherein the signal inputs to the computer are guarded against invalid readings.

The control system according to the present invention involves electro-optical devices each upon a computer input for coupling an external command, or status signal, to a logic input for the solid state devices handling data within the computer. Typically, an external signal, in the form of a 120 volt, 60 Hertz voltage, is applied to the electro-optical device whenever the command, or status, logic is translated into a closed position for a relay, pushbutton, or similar electromechanical device. When appears, within the control system, a signal indicating a particular command, or status, such as YES, ON, GO, START, RUN, STOP, having a positive meaning for the corresponding input within the computer and understood as a closed connection established onto the opti-optical coupler, a 120 volt, 60 Hertz voltage is applied to the coupler Bit becomes at the output thereof a square pulse train of of equal width at the same frequency and exhibiting +5 volts as the successive polarity thereof. Normally, the computer will detect such 60 Hertz recurrent polarity as an indication that a positive command, or status, is present at the external input of the computer. When no external signal is present, there is no squarewave to be read by the computer, only a constant low voltage.

With such a system, however, there is a risk of false reading in two situations: first, a noise might occur at the instant of reading falsely appearing as if it belonged to a High of a squarewave when there is none; secondly, a failure of the opto-coupler places a constant High at its output, again interpreted by the computer as a signal present on the external input line. In order to reliably distinguish between a genuine signal and such false readings, it has been proposed to use a sampling technique wherein three measurements of the input signal are made at 120 degrees in relation to six successive line cycles. See U.S. Pat. No. 4,456,867 of George Mallick et al.

The prior art has also considered, in a different context, error detection in the presence of a train of pulses. For instance, U.S. Pat. No. 3,646,453 shows detecting an error whenever two successive pulses of the same polarity are received where a bipolar signal was expected. In U.S. Pat. No. 3,961,203 the aim is at the correlation of positive and negative pulse pairs. U.S. Pat. No. 3,942,037 shows edge sensing to detect a positive, or a negative, transition on the inputted signal. In U.S. Pat. No. 4,179,625 a digital input is analyzed by using delayed leading and trailing edges and a comparator determines whether a noise pulse has been detected. U.S. Pat. No. 4,525,635 involves two successive latchings of the received input signal to eliminate a transient signal. U.S. Pat. No. 4,353,032 relates to glitch detection in a sampled data acquisition system. U.S. Pat. No. 4,409,635 shows the use of two voltage measurements to detect failures in the interface circuit of a microcomputer-based control system.

SUMMARY OF THE INVENTION

In order to test the validity of the AC inputs of a computer-based control system in which opto-couplers are used to transmit a squarewave at a constant frequency as an indication of a positive request for control at the input of the computer, a synchronized reference square wave signal of the same frequency is used for comparison purpose with the input signal. The reference signal is delayed just enough to create a slight overlap in time between the respective notches, and the instantaneous value of the received input signal is sampled and stored in digital form by latching upon two successive instants, first upon a trailing (or rising) edge occurrence in said reference signal, secondly upon the occurrence of the subsequent rising (or trailing) edge in said reference signal, for deriving two successive digital states. Only one combination of different such successive states as latched is indicative of a valid command, or status, signal at the input. The other combination of different digital states, or any successive occurrence of the same digital state twice, would be indicative of a faulty condition, either in the original signal, or in the intervening opto-coupler.

This approach to input validity testing requires only two samples closely related in time and, therefore, uses a minimal processing time, thereby minimizing the number of RAM bytes to be affected to input treatment.

DESCRIPTION OF THE INVENTION

The invention is hereinafter illustrated successively as part of a control system pertaining to an AC motor drive and as part of an automatic transfer switch.

The AC motor drive has been more specifically described in U.S. Pat. No. 4,304,243, or in U.S. Pat. No.

4,456,867. For the purpose of describing a computer-based AC motor drive, the two patents are hereby incorporated by reference.

Figure 1:
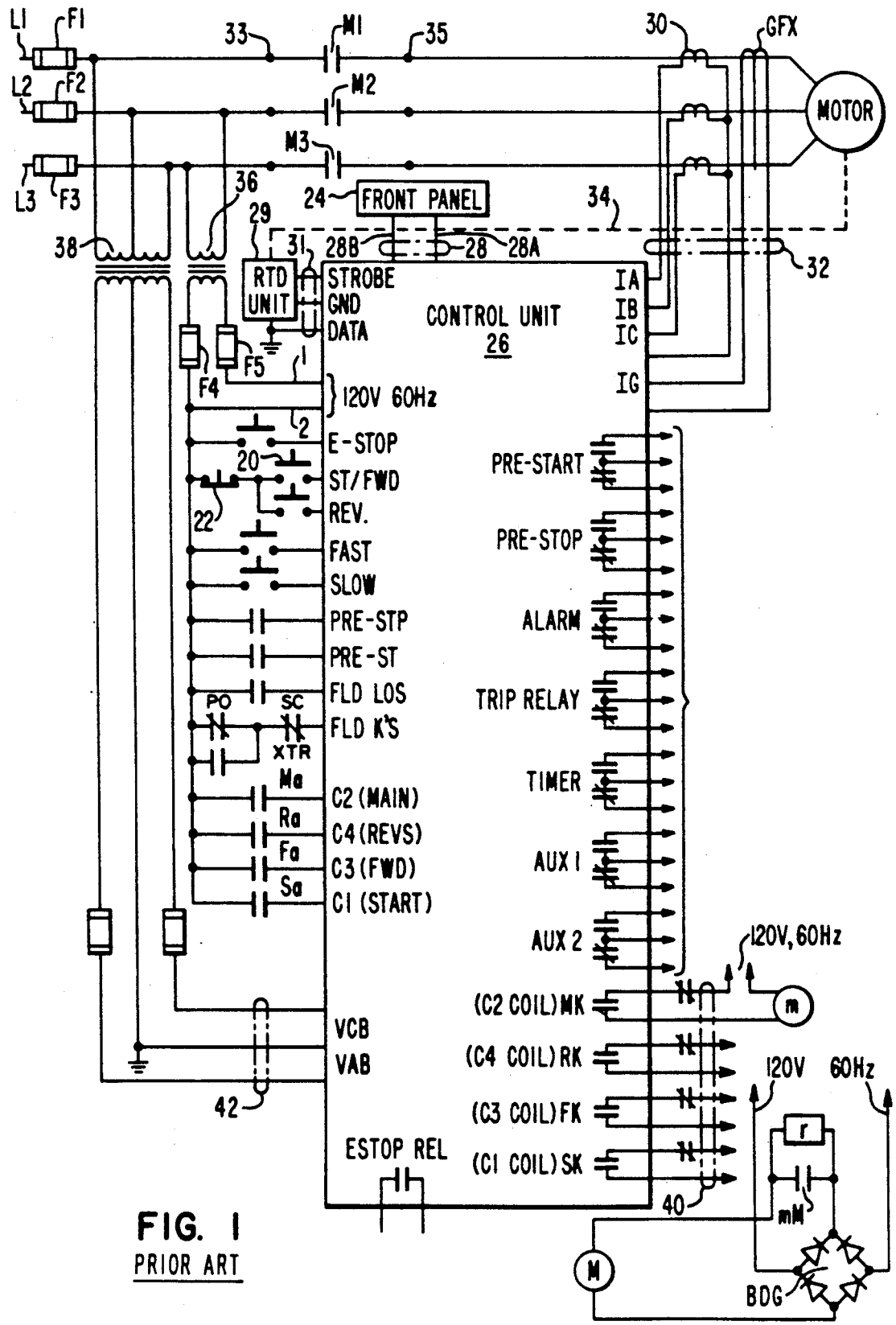
FIG. 1 shows an AC motor drive as illustration of a control system embodying the present invention.

FIG. 1, taken from U.S. Pat. No. 4,456,867, shows a motor controller with its control unit 26 responding to a series of contacts and pushbuttons at the input. The motor is supplied with AC current from the mains of an AC power supply at 120 volts and 60 Hertz (L1, L2, L3). Main switches having line contacts M1, M2, M3, will be closed when a coil C2 is energized (contacts MK) in accordance with an operator command closing contacts Ma at the input of the controller unit. Considering such a command to the motor drive, it is important for motor control that the fact whether contacts Ma are open, or closed, be interpreted without error. It is the object of the present invention to ascertain whether an external input to a computer-based control system, like such contacts Ma to a motor drive, is valid for the control unit to perform the corresponding command. FIG. 1 also shows contacts and pushbuttons installed at the input of the control unit, such as E-STOP; ST/FWD; REV; FAST; SLOW; PRE-STP; ... "all well known command, or status, external input signals for an AC motor drive" which are to be handled by the control unit at various stages of motor operation, as shown in the incorporated-by-reference U.S. patents.

It is also observed that upon each contact, or pushbutton, is applied from the mains the 120 v, 60 Hz voltage. Therefore, whenever such contacts, or pushbuttons, are closed, the AC voltage from the mains, at the primary 36 of the transformer shown in FIG. 1, is applied at a corresponding input of the control unit. In addition, the afore-stated transformer (primary 36) applies directly, via lines 1 and 2, the 120 v, 60 Hz voltage to the control unit. It will be shown hereinafter how this voltage will be converted into a reference voltage to be used, in accordance with the present invention, in order to ascertain the validity of an input to control unit 26. It is understood that the control unit 26 embodies a microcomputer which routinely interrogates and handles all the inputs.

Figure 2:
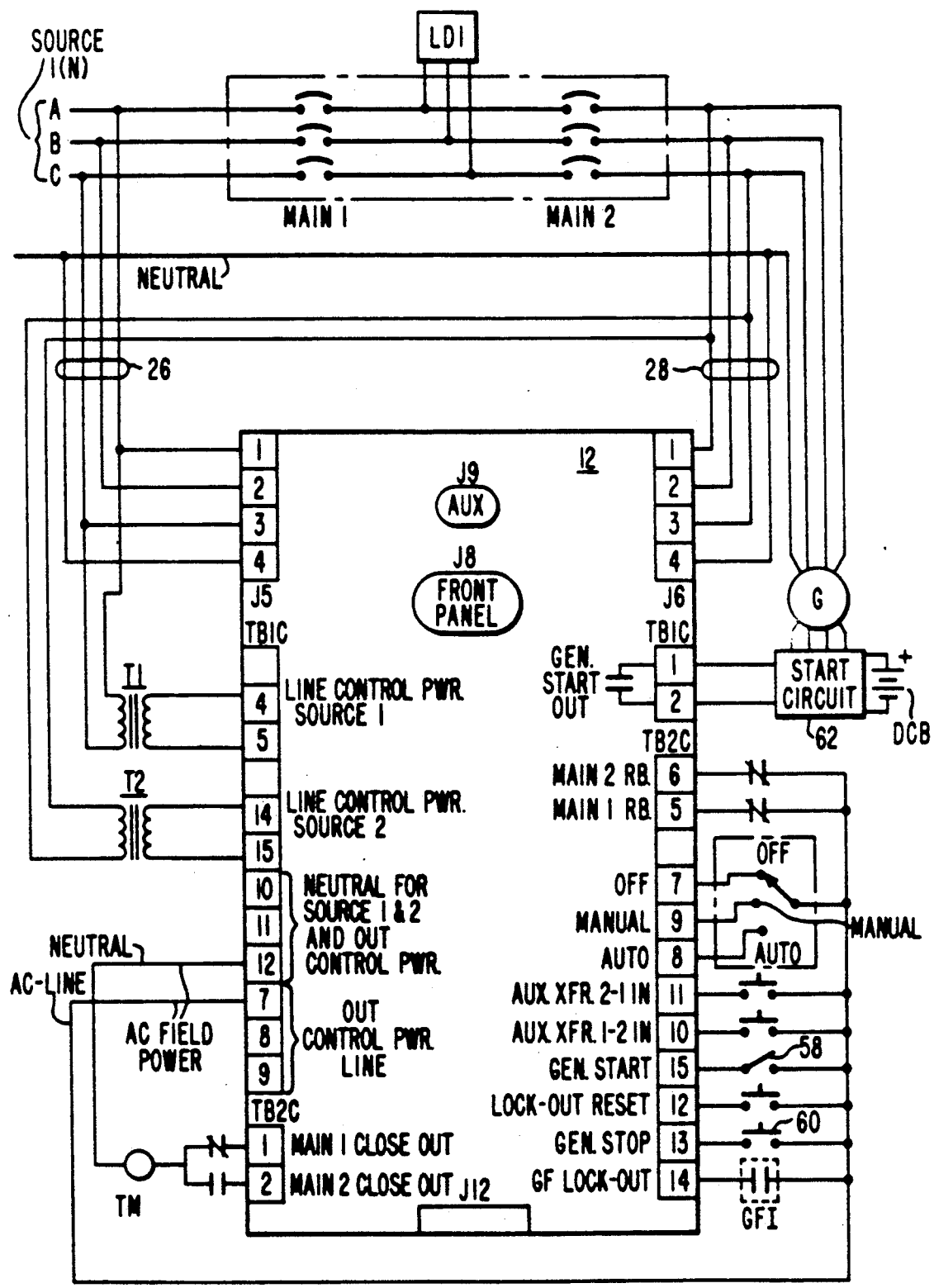
FIG. 2 shows an automatic transfer switch as another illustration of a control system embodying the present invention.

FIG. 2 shows a microprocessor-based automatic transfer switch (ATS) providing automatic, or manual, transfer by switching from one power source to a second power source in case of an emergency. This has been disclosed in U.S. Pat. No. 4,747,061 entitled "Automatic Transfer Switch For a Wide Range of Source Voltage". U.S. Pat. No. 4,747,061 is hereby incorporated by reference.

Referring to FIG. 2, in an automatic transfer switch, the control unit involves a plurality of contacts, pushbuttons, which determine the operation of a load LD1 either under a SOURCE 1, or a SOURCE 2, here represented as an auxiliary generator G, to be started by a start-circuit 62, depending upon the closing of switches MAIN 1 and MAIN 2. Electrical energy for the control unit 12 may be derived from SOURCE 1, or SOURCE 2, as shown by transformer T1 from phases A and C of SOURCE 1 with inputs 4 and 5 into terminal board TB1C of the control unit 12, and by transformer T2 from phases A and C of SOURCE 2 with inputs 14 and 15 into terminal board TB1C of control unit 12.

Externally, a portion of this power is supplied by way of terminals 7 and 12 of terminal board TB1C as the AC LINE and NEUTRAL AC field power for the various external elements interconnected with main controller 12 or the option board 22. The electrical power derived from SOURCE 1 and SOURCE 2, as well as the field power, is 120 volt alternating current. Terminal 6 on terminal board TB2C is entitled MAIN 2 REPORT BACK (RB2) and terminal 5 thereof is entitled MAIN 1 REPORT BACK (RB1). Both of these are externally fed from auxiliary contacts on the circuit breakers MAIN 2 and MAIN 1, respectively. When the circuit breaker MAIN 2 is closed, normally open contacts RB2 are closed, thereby applying AC voltage on terminal 6 of terminal board TB2C. When the circuit breaker MAIN 1 is closed, contacts RB1 are closed, providing AC voltage on terminal 5 of terminal board TB2C. Terminals 7, 8 and 9 of terminal board TB2C are externally connected to the OFF, AUTO, and MANUAL output terminals of a mode selector switch. Correspondingly, the input terminals 7, 8 and 9 of terminal board TB2C are identified as OFF, AUTO and MANUAL, respectively. When the mode selector switch is in the OFF state, controller 12 does not operate to control the circuit breakers MAIN 1 or MAIN 2. If on the other hand, the mode selector switch is in the MANUAL state, the control 12 may be manually manipulated to place the circuit breakers MAIN 1, MAIN 2 in conduction, or non-conduction. Finally, when the mode selector switch is in the AUTO mode, controller 12 will operate to automatically cause the circuit breakers MAIN 1, MAIN 2, to open, or close, in accordance with a predetermined set of conditions which are programmed into the controller 12. Input terminals 10 and 11 of terminal board TB2C are entitled AUXILIARY TRANSFER 1-2 (AUX1) and AUXILIARY TRANSFER 2-1 (AUX2) respectively. These terminals are connected to pushbutton switches also connected to the AC LINE lead. When the mode selector switch is in the MANUAL mode, actuation of a pushbutton will cause a transfer of power from SOURCE 1 to SOURCE 2 by appropriate operation of the circuit breakers MAIN 1, MAIN 2. On the other hand, if the operator depresses another pushbutton, the controller will cause transfer of power from SOURCE 2 to SOURCE 1 by corresponding operation of the circuit breakers MAIN 1, MAIN 2. Terminal 14 of terminal board TB2C is designated GF LOCK-OUT (GFLO) and it is connected to a contact device designated GFI which may be part of a separate ground fault sensing system. The contact GFI is powered by the AC LINE lead. Terminal 12 of terminal board TB2C is connected by way of a pushbutton to the AC LINE lead. Terminal 12 is designated as LOCK-OUT RESET (LOR). In the event that a ground fault lock-out has occured by actuation of the GFI relay, the controller 12 will prevent closure of all circuit breakers MAIN 1, MAIN 2. In order to return to normal operation, a pushbutton is actuated which in turn will reset the circuit breakers MAIN 1, MAIN 2 if they tripped, regardless of what status the mode selector switch is in, and provided the ground fault has cleared. Terminals 13 and 15 of terminal board TB2C are designated GENERATOR STOP and GENERATOR START, respectively. These cooperate internally with the output terminals 1 and 2 of terminal board TB1C which are collectively designated GENERATOR OUTPUT START. An auxiliary generator starting system may be externally interconnected with the terminals 1 and 2 of terminal board TB1C for starting the auxiliary generator at an appropriate time for supplying power to the system. For example, SOURCE 2 may be the auxiliary generator. The actuation of the generator will take place regardless of whether the mode selector switch is in the MANUAL, or AUTO mode. Terminals 10, 11 and 12 of terminal board TB1C represent the common NEUTRAL for SOURCE 1, SOURCE 2 and the output control or field power lead AC LINE. Terminals 8 and 9 of terminal board TB1C cooperate with terminal 7 thereof to provide the aforementioned output field power. The closing coils for circuit breakers MAIN 1 and MAIN 2 are interconnected externally to the input terminals 1 and 2 of the terminal boards TB2C. These outputs are designated CLOSE 1 and CLOSE 2 respectively. Energization of terminals 1 and 2 of terminal board TB2C will actuate the closing coils CC for the circuit breakers MAIN 1 and MAIN 2 and close those circuit breakers.

SOURCE 2 in FIG. 1 is illustrated as an auxiliary generator G. There may be provided a transfer motor TM interconnected by way of relay contacts with terminals 1 and 2 on terminal board TB2C. Furthermore, there is interconnected with the terminals 1 and 2 of terminal board TB1C a starting circuit 62 for the generator G. Also, interconnected with terminal 15 of terminal board TB2C is a start pushbutton 58 for the generator start circuit 52. There is connected with terminal 13 of terminal board TB2C a stop pushbutton 60. Manual actuation of the start pushbutton 58 will cause the internally connected GENERATOR START OUTPUT contact to close, thus energizing the start circuit 62 of the generator G and bringing generator G to provide electrical power on phase lines A, B and C. Actuation of the pushbutton 60 will stop the generator G in a similar manner.

Figure 3:
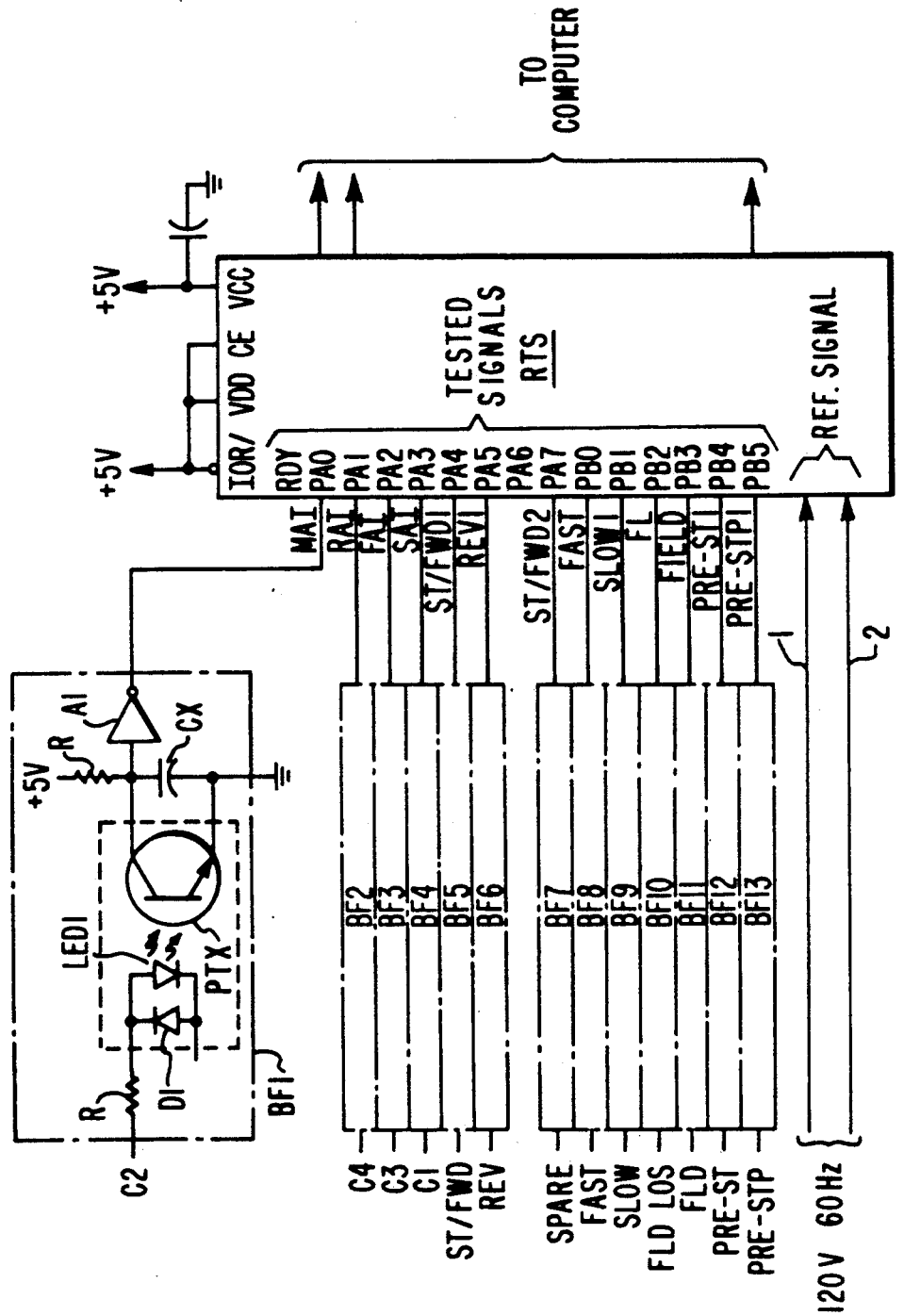
FIG. 3 shows the implementation with auto-couplers of the reliability test according to the present invention as part of the control unit found in FIG. 1 and the computer associated with the motor drive.

Referring to FIG. 3, the inputs stated earlier by reference to FIG. 1 which are the signals to be tested) are here shown to be inputted into respective opto-couplers BF1, ... BF14 (as shown in the aforementioned U.S. Pat. No. 4,456,867) which are inputting into the reliability test circuit RTS according to the present invention. Circuit RTS also receives, from lines 1 and 2 the 120 v, 60 Hz voltage through an opto-coupler BF14 from line 1, and 2 to generate therein a digital reference signal, as explained hereinafter. At the output, circuit RTS provides the computer MP with validated inputs for handling upon request. Each coupler includes a luminescent diode LED1 and a photo-sensitive transistor PTX. As generally known, when the diode is energized (namely when associated external contacts, or pushbutton, are closed and the 120 v, 60 Hz is applied onto the antiparallel pair of diodes D1 and LED1, the base electrode of the transistor is energized and a 5 v potential is applied (after inversion by device A1) representing a High, or a One, digitally to the input of circuit RTS. An opto-coupler may consist in a device sold on the open market under the name of Siemens, Litronix Division Product, as shown in Litronix Division Optoelectronics Catalog 1982/1983. It is observed that for the control unit of the motor drive, what is important is to know as seen from the computer address, whether, at an interrogated input, the signal received externally to the opto-coupler is ON, namely whether the command is to START, STOP, ACCELERATE, RUN, GO, REVERSE, FORWARD. Accordingly, a valid signal is a signal which is truly ON.

Figure 4A:
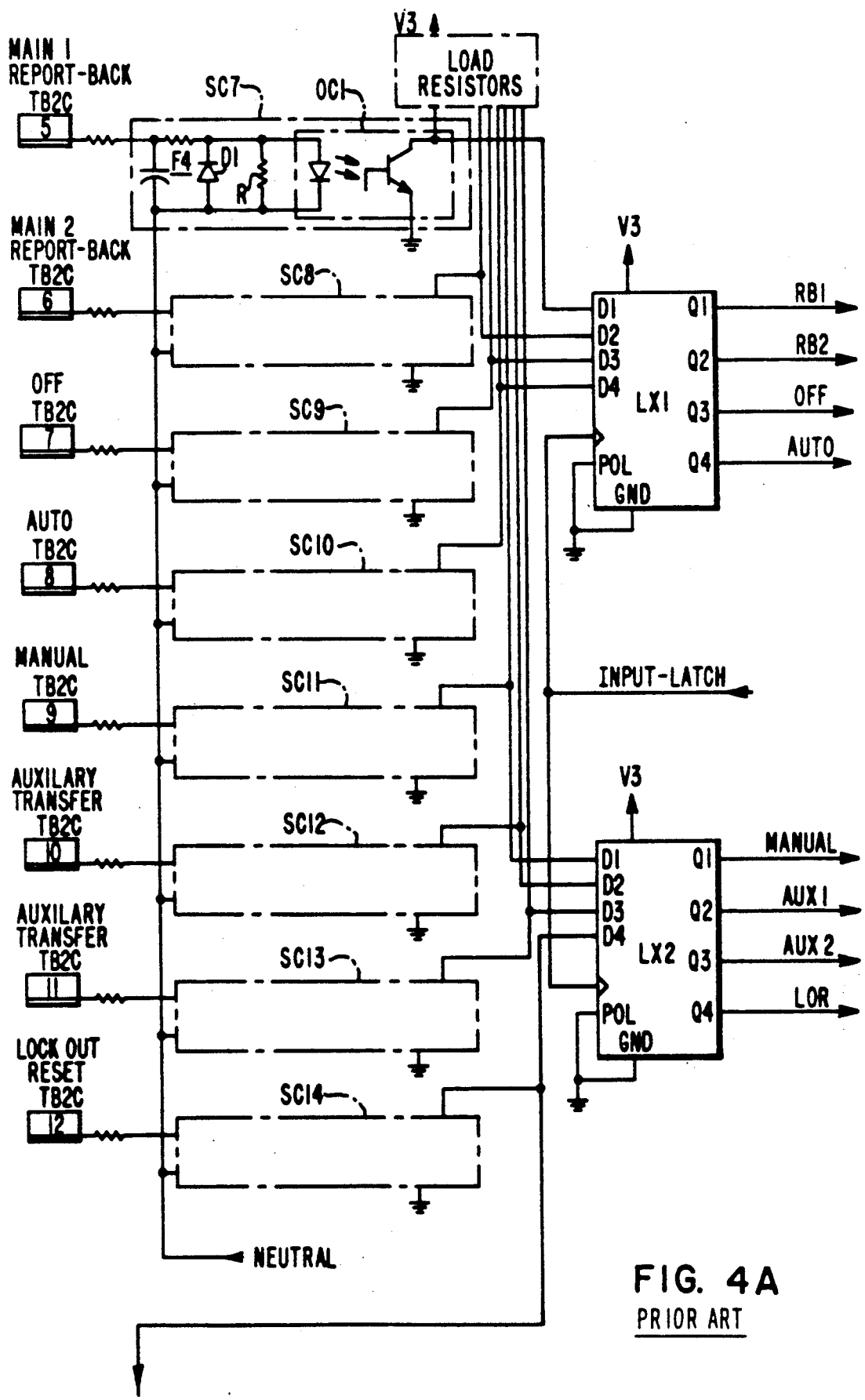
FIGS. 4A and 4B show the opto-couplers and the latches involved in the reliability test according to the present invention which is part of the control unit found in FIG. 2 for the automatic transfer switch thereof.
Figure 4B:
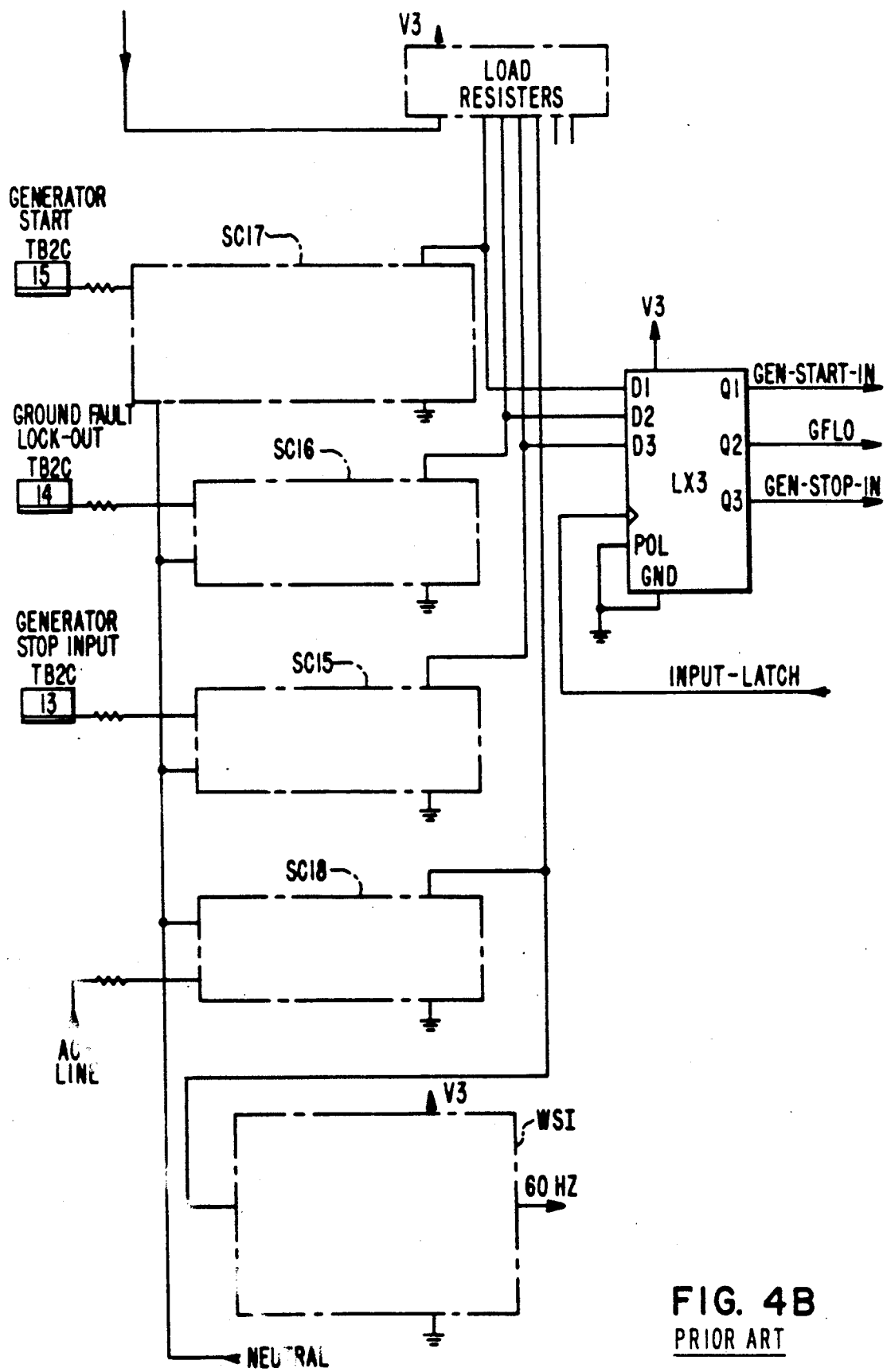

Referring to FIGS. 4A and 4B, like for the motor drive of FIG. 1, opto-couplers are shown in relation to input signals operating with a control unit between an automatic transfer switch like in FIG. 2 and the associated computer.

FIGS. 4A and 4B show the conversion by opto-couplers SC7 to SC14 (FIG. 4A) and SC15 to SC18 (FIG. 4B) into digital form of eleven of signals to be tested as stated by reference to FIG. 3. These signals are upon terminal board TB2C as follows:

MAIN 1 REPORT BACK on terminal 5 for SC7;
MAIN 2 REPORT BACK on terminal 6 for SC8;
OFF on terminal 7 for SC9;
AUTO on terminal 8 for SC10.

These signals are associated with data inputs D1, D2, D3 and D4 of a latch LX1 outputting respective outputs RB1, RB2, OFF and AUTO for a group X of four signals.

Similarly:
MANUAL on terminal 9 for SC11;
AUXILIARY TRANSFER on terminal 10 for SC12;
AUXILIARY TRANSFER on terminal 11 for SC13;
LOCK OUT RESET on terminal 12 for SC14.

All these on respective data inputs of a latch device LX2 outputting signals MANUAL, AUX1, AUX2, LOR pertaining to a group Y.

Then, FIG. 4B shows three more signals:
GENERATOR START on terminal 15 for SC17;
GROUND-FAULT LOCK-OUT on terminal 14 for SC16;
GENERATOR STOP INPUT on terminal 13 for SC15.

These signals are distributed upon the respective data inputs of a third latch device LX3 outputting in a group Z signals: GEN-START-IN; GGLO; GEN-STOP-IN.

The 120 v, 60 Hz line voltage is also brought to provide a reference signal in the form of square pulse at 5 v and 60 Hz, on line 7.

Figure 5:
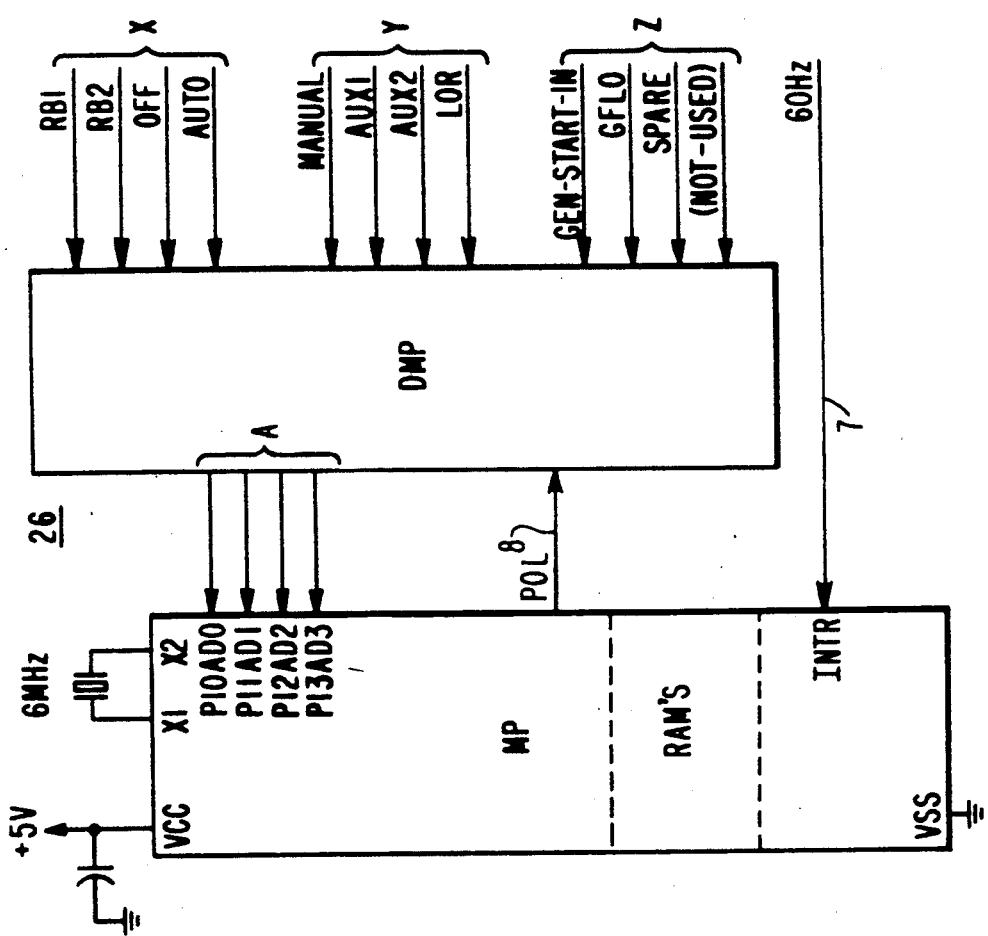
FIG. 5 shows the hardware interface between the digital inputs to be validated and the computer embodying the RAM's and effecting the reliability test.
Figure 6:
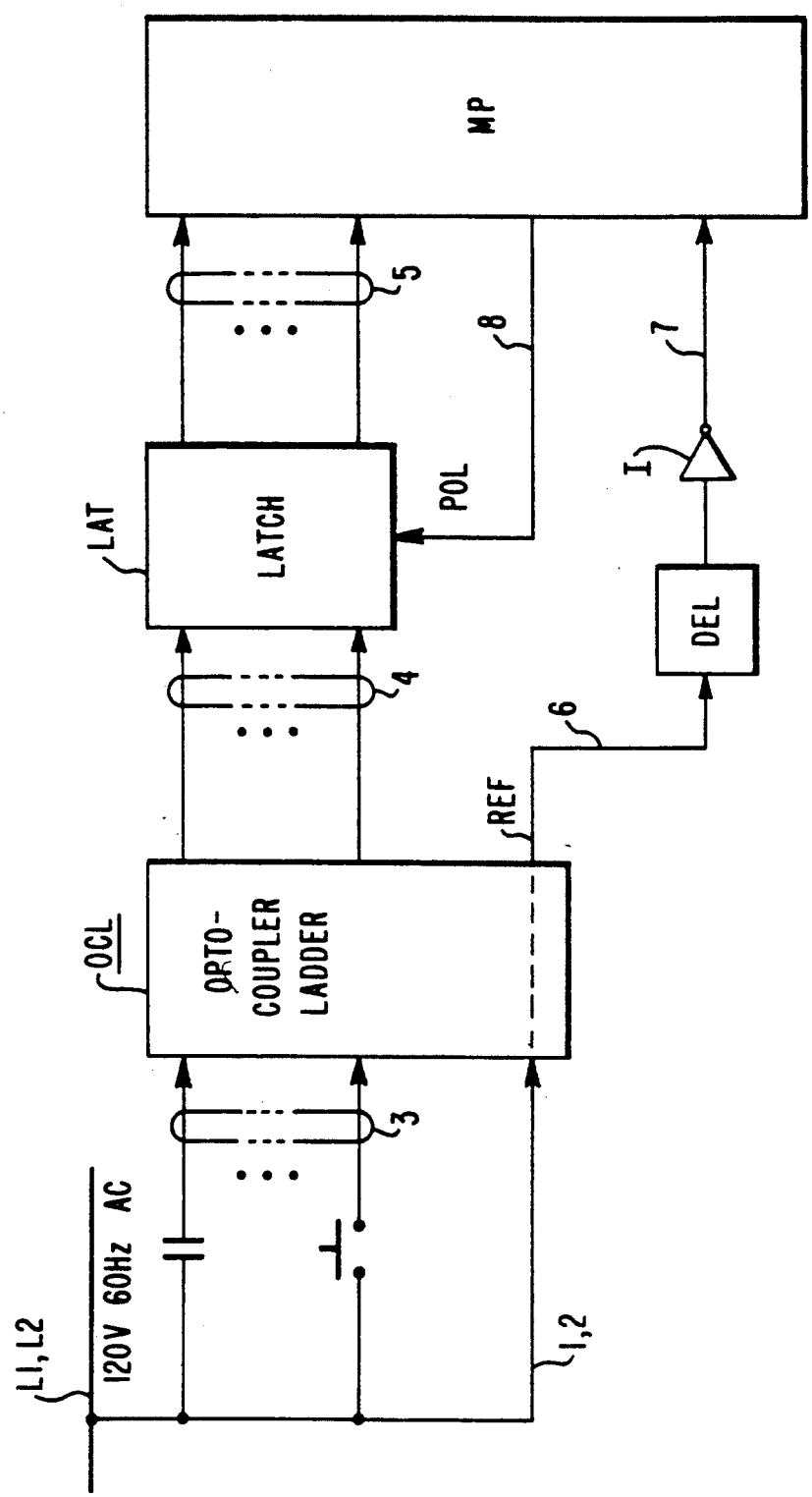
FIG. 6 is a block diagram illustrating the key elements of the reliability test circuit according to the present invention.

FIG. 5 shows the microcomputer MD receiving on four input lines A the group X, Y, or Z after multiplexing by a multiplexer DMP. The microcomputer also receives the reference signal at 60 Hertz on line 7. Within the microcomputer are RAM devices handling the logic of the received digital signals so as to make the comparison with a standard logic in order to establish the validity of each inputted signal. FIG. 6 shows in block diagram how the validity test is conducted between an input signal and the reference signal of line 7 received from the opto-coupler ladder OCL. How a distinction is made between a valid and a faulty indication, based on what has been received from the outside of the opto-couplers, will be shown hereinafter by reference to FIGS. 7 and 8.

Figure 8:
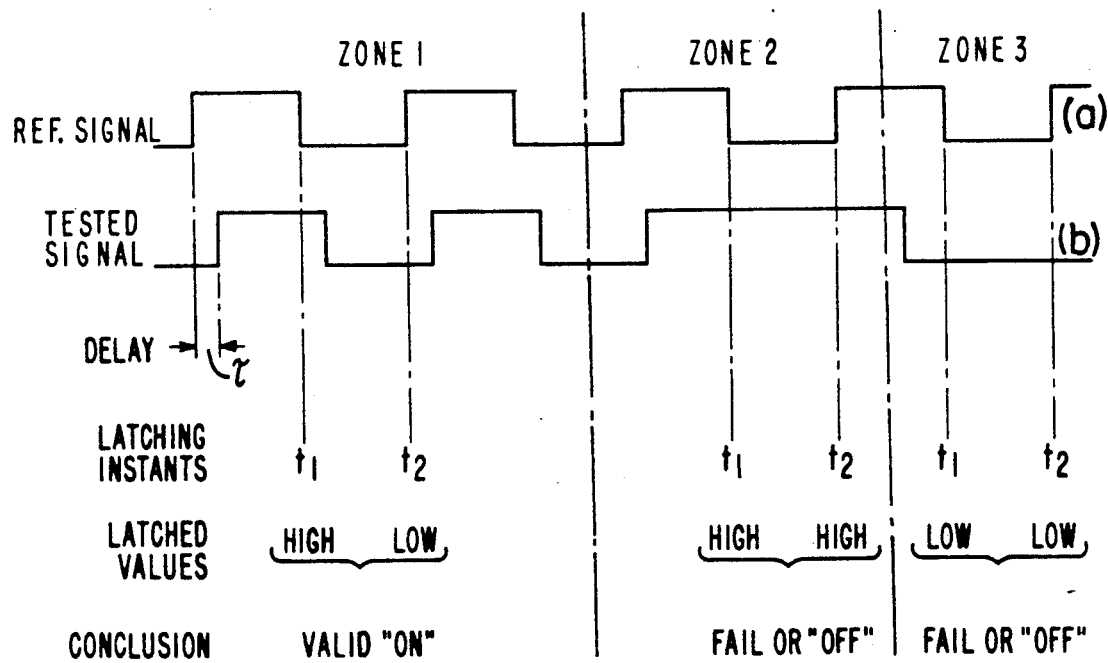
FIG. 8 illustrates with a reference signal the reliability test effected upon a received input signal in accordance with the present invention.

In FIG. 6, the reliability testing circuit of FIG. 3 is shown to respond to the outputs of opto-couplers symbolized by an opto-coupler ladder OCL receiving its inputs according to the states of contacts and push-buttons like in FIG. 1, or FIG. 2. Direct lines 1, 2 are also shown carrying the 120 v, 60 Hz line voltage. Lines 4 are the many outputs interrogated, each carrying an external signal representation in logic form to be tested. These outputs are inputted into a latch LAT which is controlled by computer MP to toggle twice, upon instants t1 and t2 (as shown in FIG. 8), the value read from line 4 being thereby stored before being read by the computer MP from lines 5. The test is commanded by the computer on line 8 (command POL) and toggling of the polarity to the latch is effected as shown in FIG. 5 and as generally known. It will be shown by reference to FIG. 8, that this occurs twice successively, upon the occurrence illustratively of the falling and the rising edge of a reference signal, consecutively. Such reference signal is derived from the opto-coupler ladder OCL with a delay established at DEL. The computer then reads the occurrence of the edges from line 7 at the output of delaying device DEL.

In FIG. 2 have been shown eleven signals which are now to be tested for validity. These signals also appear in FIGS. 4A, 4B and in FIG. 5 where they are grouped under X, Y and Z. The computer toggles a corresponding latch (latch LX1 for group X; latch LX2 for group Y and latch LX3 for group Z). Thus, testing is effected with respect to the interrogated input (pin D1, D2, D3, D4) thereby outputting the valid signal (RB1, RB2, OFF, AUTO for latch LX1, and similarly for the two other latches of FIGS. 4A and 4B).

Typically, the opto-couplers may be devices such as shown in Siemens, Litronics Division, Optoelectronics Catalog 1982/1983, page 193, and called 7400 Series T2L Compatible. The latches LX1, LX2 and LX3 may be devices such as shown in: "RCA Solid State Databook"/CMOS Integrated Circuits—page 172—called CMOS Quad Clocked "D" Latch (type CD4042B).

The outputs on pins Q1 to Q4 from latch LX1 of FIG. 4A (group X), the outputs on pins Q1 to Q4 from latch LX2 of FIG. 4A (group Y) and the three outputs on pins Q1 to Q3 from latch LX3 of FIG. 4B (group Z) are received by a multiplexer DMP (FIG. 5) which outputs for interrogation into four pins of the computer MP (P10, P11, P12, P13, P14). The reference signal is received by the computer on line 7 (pin INTR of FIG. 5). RAM's are contained within the microcomputer (as well known) which are used in the comparison required in accordance with the steps of FIG. 8.

Figure 7:
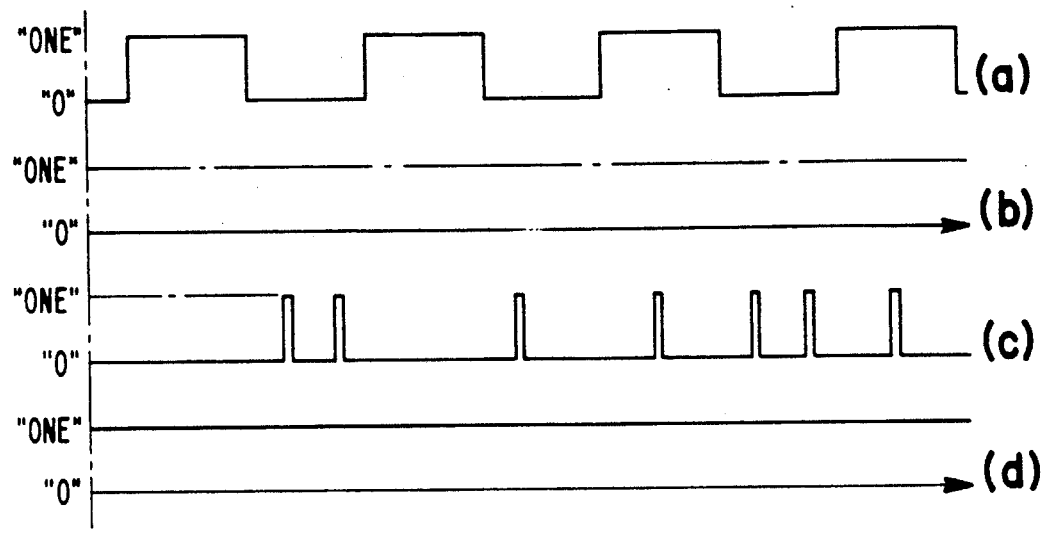
FIG. 7 provides signals among which one is a valid input signal and the three others correspond to faulty situations to be guarded against.

Referring to FIG. 7, under (a) is shown the signal at the output of the opto-coupler (like BF1 in FIG. 2) when the interrogated external signal is rightly the 120 v, 60 Hz line voltage due to the switch, or contacts, being in a closed position. The curve shows a train of square pulses occurring at the frequency of the inputted main voltage. Therefore, the computer would, normally, detect a succession of One's and Zero's. If the command does not exist, the contacts are open and there is no voltage applied to the opto-coupler. Accordingly, as shown by curve (b), there is a continuous Zero logic at the output of the opto-coupler. Should, however, at the moment of sampling a noise appear on the line, as shown by (c) the reading will be as if there would be a High, thereby falsely leading to the conclusion that the external signal is ON. Another situation is illustrated by (d): if the opto-coupler is failing, there could be a constant voltage on its output line, again translating falsely the presence of an ON status from the external signal.

FIG. 8 illustrates with curves validity testing according to the present invention. Under (a) is shown the reference signal illustratively obtained as output from an opto-coupler using at its input the 120 v, 60 Hz main voltage (corresponding to lines 1 and 2 of FIG. 3) used to provide directly the reference signal, instead of applying an external signal for that purpose. Under (b) is shown a tested input signal. Relying upon the pulse train derived from the opto-coupler, it is now proposed to compare to the reference signal (curve (a)) the signal of the interrogated input (curve (b)) as derived from its own opto-coupler. In order to be sure to be upon the edge when sampling, a small delay $\tau$ is caused to occur between the reference signal of curve (a) and the tested signal of curve (b). Upon the falling edge of the reference signal, testing is effected a first time thereby insuring that at such instant t1 the tested signal exhibit a ONE (Zone #1). After a time interval of a half a cycle, or somewhat less, another test is performed (time t2) and ZERO as observed in Zone #1 the polarity b since after a half-cycle such second testing is done upon the succeeding rising edge of the reference signal such lack of polarity indicates a valid conclusion. Should however, as under curves (c) or (d) of FIG. 7, the interrogated external signal appear as a continuous ONE (Zone #2 of FIG. 8), at instants t1 and t2 the detection will show twice a High, thus, a parity of polarities indicating an invalid reading of a ON signal. Should, the situation be like under curve (b) of FIG. 7, FIG. 8 shows that two successive Low are now being detected. Again, a parity of polarities indicates an invalid reading. In the two latter situations, the computer will know that the conclusion is failure, or an OFF external signal.

Figure 9:
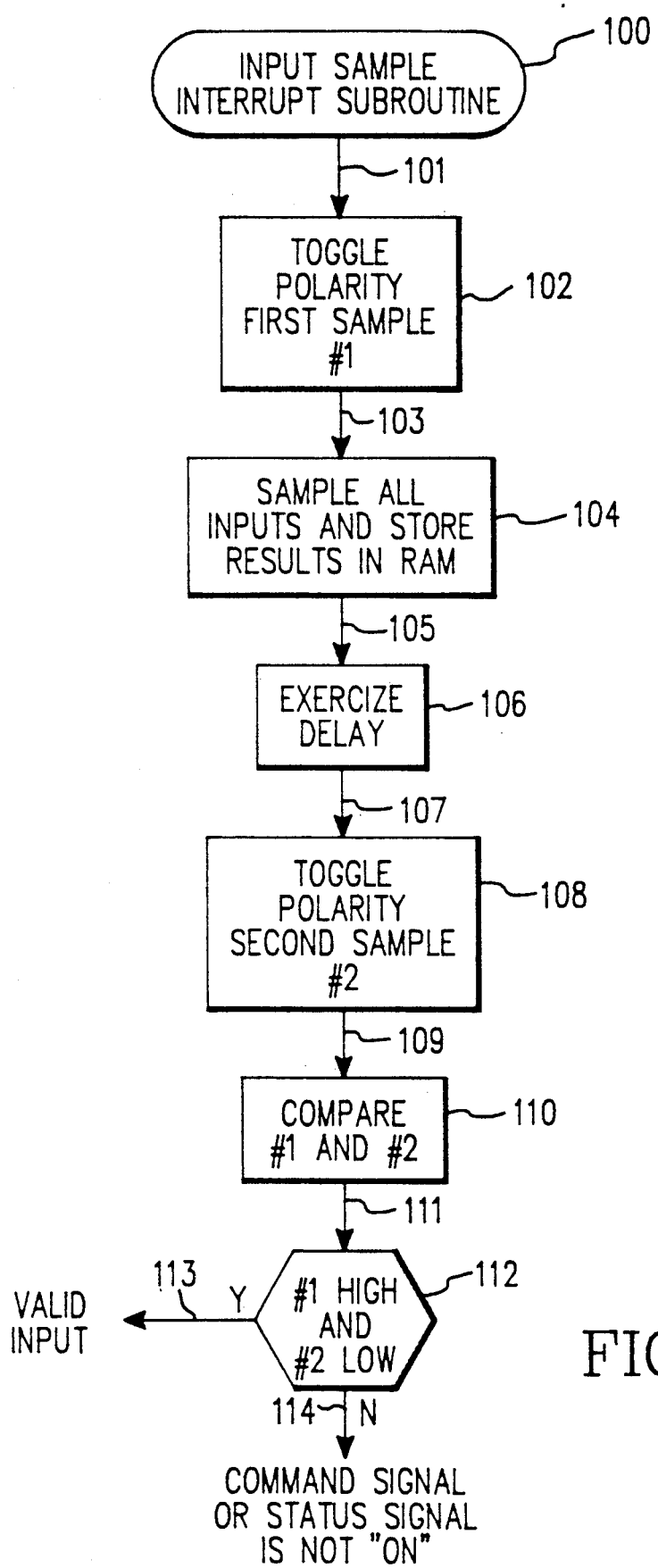
FIG. 9 is a flow chart illustrating the operation of the reliability test circuit of FIG. 6.

FIG. 9 is a flowchart illustrating the system operation with the computer of the reliability testing circuit RCT with the following:

At 100 the system provides the input sample interrupt subroutine. Then, by 101 it goes to 102 where the command is to toggle polarity at instant t1 for the first sample (sample #1 of FIG. 8). This is done by line 8 of FIG. 6. Thereafter, by 103 the system insures, at 104, that this is done for all inputs and that the sampling result is thereby stored. Thereupon, by line 105, the system goes to 108 where the second sampling (sample #2 of FIG. 8) is effected by toggling at instant t1 (again by line 8) and the second sample is stored. Then, by line 109 the system goes to 110 where the two successive samples are compared. By line 111 the question becomes at 112 whether there is a High followed by a Low? If it is YES (line 113) the input is valid and the required control can be performed. If it is NO (line 114) the external signal cannot be seen as ON. The contacts are OFF or there is a failure, along the interrogated input channel.

Figure 10A:
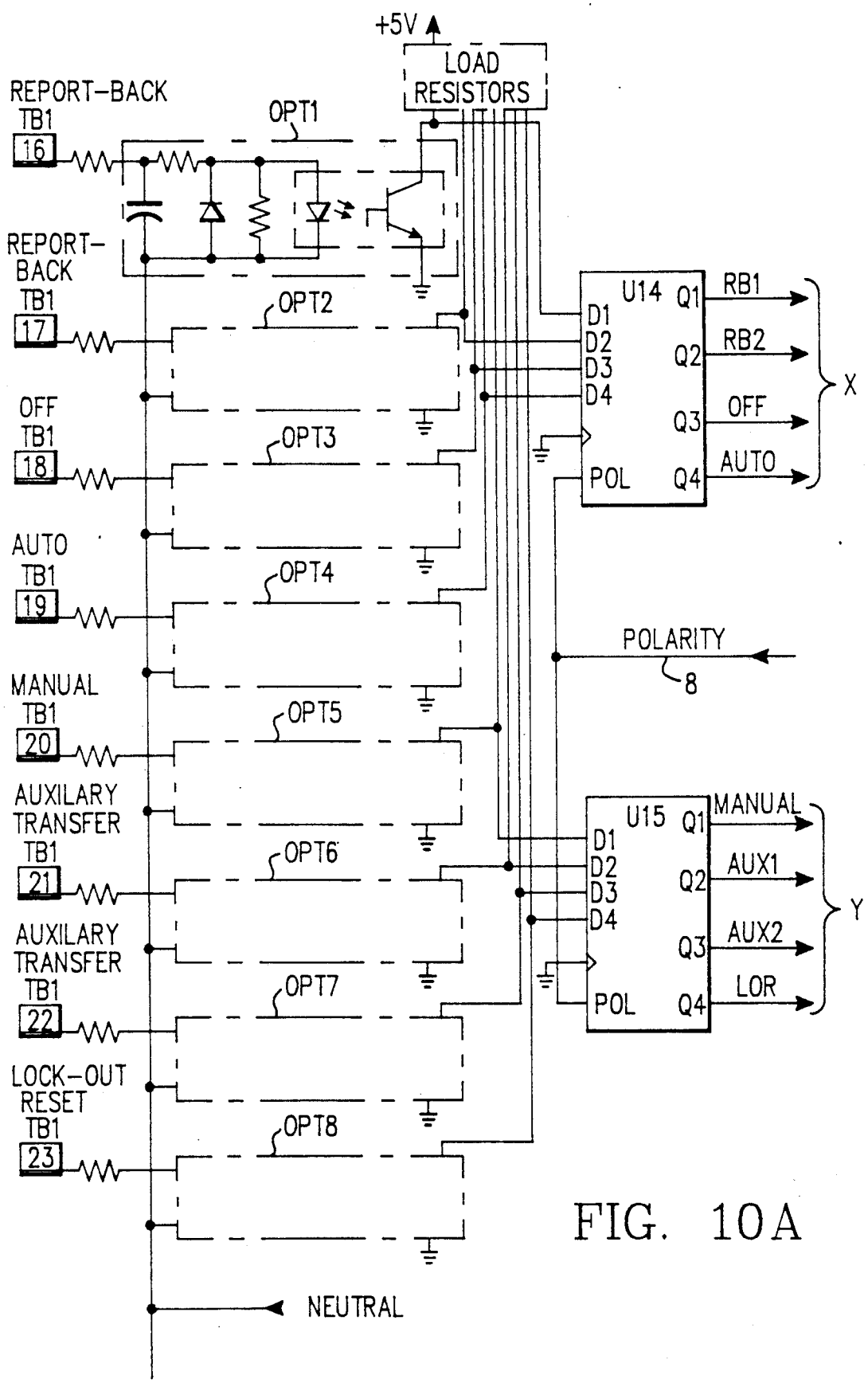
FIGS. 10A, 10B constitute FIG. 10 which shows a hardware interface between the computer and the validated inputs to the motor drive in the example of FIG. 1.
Figure 10B:
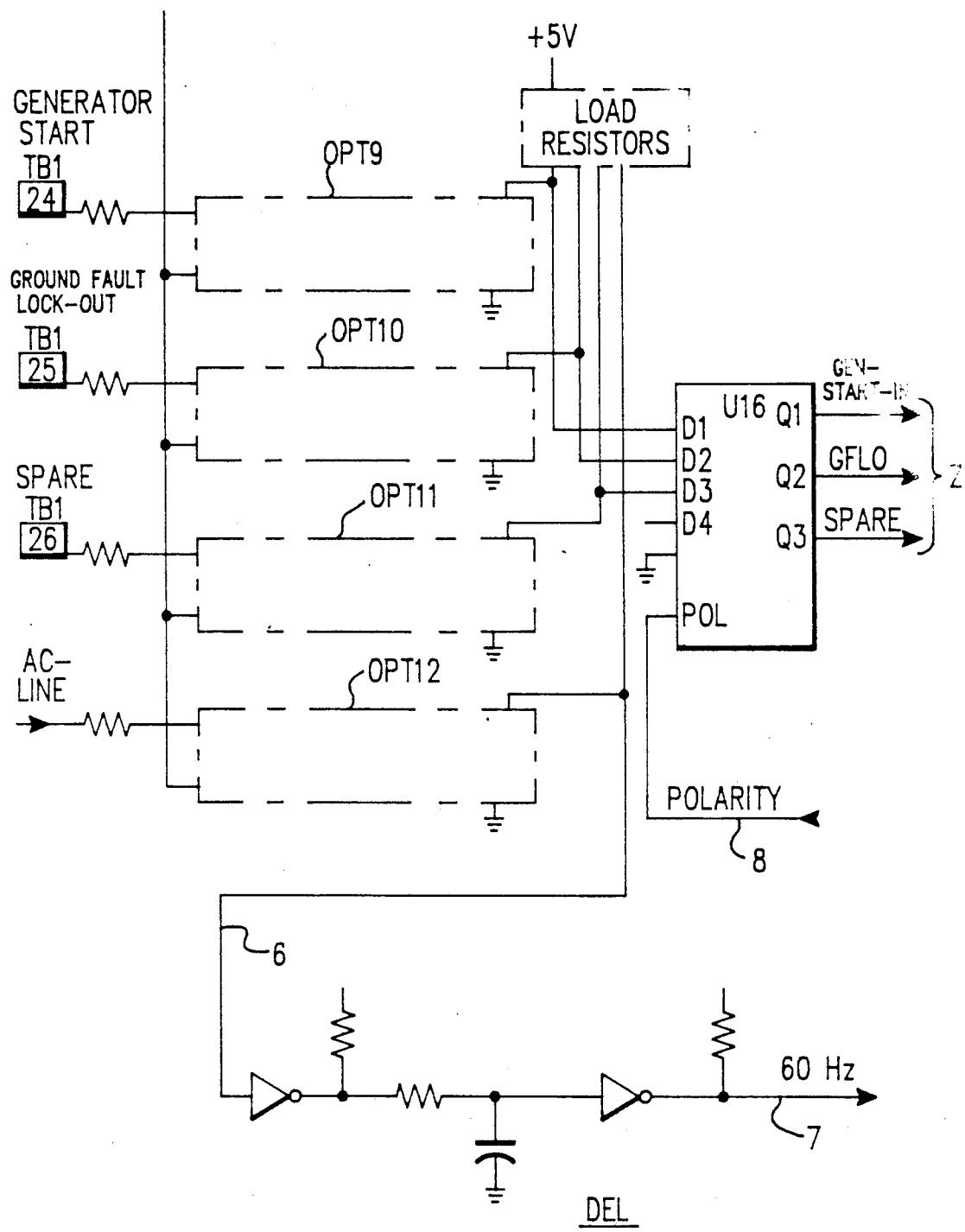

Referring to FIGS. 10A and 10B a hardware representation is provided in the illustrative embodiment of the invention of FIG. 1, namely of a motor drive. The various external signals inputs 16 to 26 of terminal board TB1 are shown connected via their opto-couplers OPT1 to OPT6, by groups of four, to three respective latches U14 and U15 in FIG. 10A, and U16 in FIG. 10B. They are similar to the earlier considered groups of signals X, Y, Z of FIG. 4A, 4B and 5. The associated computer (like MP in FIG. 5) toggles by line 8 the corresponding latch for the signal under interrogation (U14, U15 or U16) and testing results with regard to such interrogated signal (pin B1, B2, B3, B4), thereby outputting the validated signal (on pin 2, 10, 11, or 1) stating whether the motor drive should operate under control signal RB1, RB2, OFF, AUTO (for latch U14 in FIG. 10A), MANUAL, AUX1, AUX2, LOR (for latch U15 in FIG. 10A), or GEN-START-IN, GFLO, or SPARE (for latch U16 in FIG. 10B). In FIG. 10B, lines 1, 2 are shown applied to opto-coupler OPT12 which outputs on line 6 the reference signal which becomes delayed on line 7 after a delay $\tau$ due to delay circuit DEL shown to include a combination of capacitor and resistor, as generally known.

Referring to Appendix A hereinafter, a listing is provided for performing validity testing according to an automatic transfer switch like shown in FIG. 2 and performed in accordance with FIGS. 4A, 4B, 5, 8 and 9. In the Appendix, the steps are referred to from typical lines of the listing to the corresponding blocks of FIG. 9, for illustration. Thus,:

1. First sampling test (instant t1) according to block 102: on lines 281-286;

2. Sampling inputs according to block 104: on lines 287–292;
3. Second sampling test (t2) according to block 108: on lines 330 to 469;
4. Effecting a comparison according to block 110: on pages A-2, A-3, A-4;
5. Concluding as to validity according to block 112: indicated by the AND functions such as for instance on line 457.

In order to explain the peculiarity of using an AND function in recognizing a valid digital combination, it is observed that of the four logic combinations possible according to FIG. 8, the valid one is (1, 0), whereas the three other ones are (11), (00) and (01). As a preferred way of reading the correct combination, an inversion is provided of the second digit (second sampling result at t2) so that the valid combination will appear as (11) and the other ones will read (10), (01) and (00). Therefore the valid one is a combination of ONES which are ADDED by an AND function, immediately recognized.

Appendix B provides in the same context of an automatic transfer switch a listing of the software of the RAM assignments and locations for bits and bytes in the operation of the microcomputer (typically MP of FIG. 5), each group of eight lines of the listing corresponding to one signal under test.

AUTOMATIC TRANSFER SWITCH CONTROLLER.

```
LOC   OBJ            LINE   SOURCE
                     275    ;
                     276    ; THIS ROUTINE SEQUENTIALLY READS EACH INPUT PORT AND SETS OR
                     277    ; CLEARS A BIT FOR EACH INPUT PIN THAT IS IN THE ASSOCIATED RAM BYTE.
                     278    ;
                     279    ;      PORT_SELECT VALUES ARE:   A0,A1,A2,A3,B0,B1,B2
                     280    ;
00A4  7497           281    READ_INPUT_PORT:   MOV    A,#97H
00A6  7B10           282                       MOV    R3,#10H          ;TOGGLE THE POLARITY LINE
00A8  120000    F    283                       LCALL  OUT8243          ; LOW THEN HIGH
00AB  7497           284                       MOV    A,#97H
00AD  7B1F           285                       MOV    R3,#1FH
00AF  120000    F    286                       LCALL  OUT8243
                     287    ;
00B2  74A0           288                       MOV    A,#0A0H          ;READ EACH 4 BIT INPUT PORT
00B4  120000    F    289                       LCALL  IN8243
00B7  C4             290                       SWAP   A
00B8  440F           291                       ORL    A,#00001111B
00BA  5200           292                       ANL    MAIN_INPUT_FLGS,A
                     293    ;
00BC  74A1           294    PORT_TEST2:        MOV    A,#0A1H
00BE  120000    F    295                       LCALL  IN8243
00C1  44F0           296                       ORL    A,#11110000B
00C3  5200           297                       ANL    MAIN_INPUT_FLGS,A
                     298    ;
00C5  74A2           299    PORT_TEST3:        MOV    A,#0A2H
00C7  120000    F    300                       LCALL  IN8243
00CA  C4             301                       SWAP   A
00CB  440F           302                       ORL    A,#00001111B
00CD  5200           303                       ANL    MORE_MAIN_FLGS,A
                     304    ;
00CF  74A3           305    PORT_TEST4:        MOV    A,#0A3H
00D1  120000    F    306                       LCALL  IN8243
00D4  44F0           307                       ORL    A,#11110000B
00D6  5200           308                       ANL    MORE_MAIN_FLGS,A
                     309    ;
00D8  74B0           310    PORT_TEST5:        MOV    A,#0B0H
00DA  120000    F    311                       LCALL  IN8243
00DD  C4             312                       SWAP   A
00DE  440F           313                       ORL    A,#00001111B
00E0  5200           314                       ANL    OPTION_IN_FLGS,A
                     315    ;
00E2  74B1           316    PORT_TEST6:        MOV    A,#0B1H
00E4  120000    P    317                       LCALL  IN8243
00E7  44F0           318                       ORL    A,#11110000B
00E9  5200    F      319                       ANL    OPTION_IN_FLGS,A
                     320    ;
00EB  74B2           321    PORT_TEST7:        MOV    A,#0B2H
00ED  120000    F    322                       LCALL  IN8243
00F0  440F           323                       ORL    A,#00001111B
00F2  5200           324                       ANL    OPTION_OUT_FLGS,A
                     325    ;
00F4  20B402         326    READ_IN_TEST:      JB     TO_READ_AGAIN
00F7  80FB           327                       JMP    READ_IN_TEST
                     328    ;
                     329    ; TOGGLE THE POLARITY LINE FROM HIGH TO LOW THEN
```

AUTOMATIC TRANSFER SWITCH CONTROLLER,

| LOC | OBJ | | LINE | SOURCE | | |
|---|---|---|---|---|---|---|
| | | | 385 | | MOV | G_F_O_C,C |
| | | | 386 | " | | |
| 0149 | 9200 | E | 387 | | | |
| 014B | A2E4 | | 388 | | MOV | C,ACC.4 |
| 014D | B000 | E | 389 | | ANL | C,/SPARE1 |
| 014F | 9200 | E | 390 | | MOV | SPARE1,C |
| | | | 391 | " | | |
| 0151 | 74A3 | | 392 | | MOV | A,#0A3H |
| 0153 | 120000 | | 393 | | LCALL | IN8243 |
| | | | 394 | " | | |
| 0156 | A2E3 | | 395 | | MOV | C,ACC.3 |
| 0158 | B000 | E | 396 | | ANL | C,/LATCH_RB |
| 015A | 9200 | E | 397 | | MOV | LATCH_RB,C |
| | | | 398 | " | | |
| 015C | A2E2 | | 399 | | MOV | C,ACC.2 |
| 015E | B000 | E | 400 | | ANL | C,/SELECTION |
| 0160 | 9200 | E | 401 | | MOV | SELECTION,C |
| | | | 402 | | | |
| | | | 403 | | | |
| | | | 404 | " | | |
| | | | 405 | | | |
| | | | 406 | | | |
| | | | 407 | " | | |
| | | | 408 | | | |
| | | | 409 | | | |
| 0162 | 74B0 | | 410 | | MOV | A,#0B0H |
| 0164 | 120000 | | 411 | | LCALL | IN8243 |
| | | | 412 | " | | |
| 0167 | A2E7 | | 413 | | MOV | C,ACC.7 |
| 0169 | B000 | E | 414 | | ANL | C,/OPTION |
| 016B | 9200 | E | 415 | | MOV | OPTION,C |
| | | | 416 | " | | |
| 016D | A2E6 | | 417 | | MOV | C,ACC.6 |
| 016F | B000 | E | 418 | | ANL | C,/TRIP1 |
| 0171 | 9200 | E | 419 | | MOV | TRIP1,C |
| | | | 420 | " | | |
| 0173 | A2E5 | | 421 | | MOV | C,ACC.5 |
| 0175 | B000 | E | 422 | | ANL | C,/TRIP2 |
| 0177 | 9200 | E | 423 | | MOV | TRIP2,C |
| | | | 424 | " | | |
| 0179 | A2E4 | | 425 | | MOV | C,ACC.4 |
| 017B | B000 | E | 426 | | ANL | C,/TIE_TRIP_IN |
| 017D | 9200 | E | 427 | | MOV | TIE_TRIP_IN,C |
| | | | 428 | " | | |
| 017E | 74B1 | | 429 | | MOV | A,#0B1H |
| 0181 | 120000 | | 430 | | LCALL | IN8243 |
| | | | 431 | " | | |
| 0184 | A2E3 | | 432 | | MOV | C,ACC.3 |
| 0186 | B000 | E | 433 | | ANL | C,/CLOSE1 |
| 0188 | 9200 | E | 434 | | MOV | CLOSE1,C |
| | | | 435 | " | | |
| | | | 436 | | | |
| 018A | A2E2 | | 437 | | MOV | C,ACC.2 |
| 018C | B000 | E | 438 | | ANL | C,/CLOSE2 |
| 018E | 9200 | E | 439 | | MOV | CLOSE2,C |

AUTOMATIC TRANSFER SWITCH CONTROLLER.

```
LOC   OBJ            LINE  SOURCE
                     330   ; LATCH AND READ THE INPUTS AGAIN.
                     331   READ_AGAIN:
00F9  7497           332         MOV    A,#97H           ;LATCH THE INPUTS BY CHANGING
00FB  7B10           333         MOV    R3,#10H          ; THE POLARITY LINE TO LOW.
00FD  120000     F   334         LCALL  OUT8243
                     335   ;
0100  74A0           336         MOV    A,#0A0H
0102  120000     F   337         LCALL  IN8243
                     338   ;
0105  A2E7           339         MOV    C,ACC.7
0107  B000       F   340         ANL    C,/AUTO
0109  9200       F   341         MOV    AUTO,C
                     342   ;
010B  A2E6           343         MOV    C,ACC.6
010D  B000       F   344         ANL    C,/MANUAL
010F  9200       F   345         MOV    MANUAL,C
                     346   ;
0111  A2E4           347         MOV    C,ACC.4
0113  B000       F   348         ANL    C,/JUMPER3
0115  9200       F   349         MOV    JUMPER3,C
                     350   ;
0117  74A1           351         MOV    A,#0A1H
0119  120000     F   352         LCALL  IN8243
                     353   ;
011C  A2E3           354         MOV    C,ACC.3
011E  B000       F   355         ANL    C,/RB1
0120  9200       F   356         MOV    RB1,C
                     357   ;
0122  A2E2           358         MOV    C,ACC.2
0124  B000       F   359         ANL    C,/RB2
0126  9200       F   360         MOV    RB2,C
                     361   ;
0128  A2E1           362         MOV    C,ACC.1
012A  B000       F   363         ANL    C,/AUX_1
012C  9200       F   364         MOV    AUX_1,C
                     365   ;
012E  A2E0           366         MOV    C,ACC.0
0130  B000       F   367         ANL    C,/AUX_2
0132  9200       F   368         MOV    AUX_2,C
                     369   ;
0134  74A2           370         MOV    A,#0A2H
0136  120000     F   371         LCALL  IN8243
                     372   ;
0139  A2E7           373         MOV    C,ACC.7
013B  B000       F   374         ANL    C,/L_O_R
013D  9200       F   375         MOV    L_O_R,C
                     376   ;
013F  A2E6           377         MOV    C,ACC.6
0141  B000       F   378         ANL    C,/GEN_START_IN
0143  9200       F   379         MOV    GEN_START_IN,C
                     380   ;
0145  A2E5           381         MOV    C,ACC.5
0147  B000       F   382         ANL    C,/G_F_O_C
```

AUTOMATIC TRANSFER SWITCH CONTROLLER,

```
LOC   OBJ          LINE   SOURCE
                   440    ;
0190  A2E1         441          MOV   C,ACC.1
0192  B000         442          ANL   C,/CLOSE_TIE_IN
0194  9200         443          MOV   CLOSE_TIE_IN,C
                   444    ;
0196  A2E0         445          MOV   C,ACC.0
0198  B000         446          ANL   C,/RB_TIE
019A  9200         447          MOV   RB_TIE,C
                   448    ;
019C  74B2         449          MOV   A,#0B2:I
019E  120000       450          LCALL IN8243
                   451    ;
01A1  A2E7         452          MOV   C,ACC.7
01A3  B000         453          ANL   C,/SPARE_IN
01A5  9200         454          MOV   SPARE_IN,C
                   455    ;
01A7  A2E6         456          MOV   C,ACC.6
01A9  B000         457          ANL   C,/JUMPER2
01AB  9200         458          MOV   JUMPER2,C
                   459    ;
                   460          MOV   C,ACC.5
                   461          ANL   C,/LLLL
                   462          MOV   LLLL,C
                   463    ;
                   464          MOV   C,ACC.4
                   465          ANL   C,/KKKK
                   466          MOV   KKKK,C
                   467    ;
                   468    ;
                   469    ;
                   470    ;
                   471    ;
                   472    END_READ_PORT:
01AD  020000       473          LJMP  INTR_EXIT
                   474    ;***********************************
                   475    ;
                   476    ;
                   477    ;
                   478    ;
                   479    LASTBY:
01B0  22           480          RET
01B1  13           481    CKSUMH: DB  13H
01B2  4A           482    CKSUML: DB  4AH
                   483    ;
                   484          END
```

AUTOMATIC TRANSFER SWITCH CONTROLLER.

```
LOC  OBJ         LINE   SOURCE
                 2105   ;**********************************************
                 2106   ;
                 2107   ;                    IN8243
                 2108   ;
                 2109   ;**********************************************
                 2110   ;
                 2111   ;              8243 INPUT SUBROUTINE
                 2112   ;
                 2113   ;IN8243 SUBROUTINE INPUTS DATA FROM AN 8243 EXPANDER
                 2114   ;THE ADDRESS/DATA IS CONNECTED TO P1.0-P1.3
                 2115   ;THE PROG LINE IS CONNECTED TO P1.7
                 2116   ;THE CHIP SELECT DECODER IS CONNECTED TO P1.4-P1.6
                 2117   ;EXIT WITH DATA IN THE ACCUMULATOR BITS ACC.0 TO ACC.3
                 2118   ;A READ OF ANY PORT LEAVES THAT PORT IN A TRISTATE MODE
                 2119   ;
                 2120   #CYCLES = 17
                 2121   ;
0CBF C2AF        2122   IN8243:       CLR    EA
0CC1 E590        2123                 MOV    P1,A           ; SET PROG,CHIP,READ,PORT CODE
0CC3 00          2124                 NOP
0CC4 00          2125                 NOP
0CC5 C297        2126                 CLR    P1.7           ; PROG HIGH TO LOW TRANSITION
0CC7 00          2127                 NOP
0CC8 00          2128                 NOP
0CC9 4390OF      2129                 ORL    P1,#00001111B  ; SET DATA TO HIGH
0CCC E590        2130                 MOV    A,P1           ; READ THE DATA
0CCE 00          2131                 NOP
0CCF 00          2132                 NOP
0CD0 D297        2133                 SETB   P1.7           ; RETURN PROG HIGH
0CD2 439070      2134                 ORL    P1,#01110000B  ; DESELECT THE CHIP
0CD5 00          2135                 NOP
0CD6 D2AF        2136                 SETB   EA
0CD8 22          2137                 RET
                 2138   ;
                 2139   ;**********************************************
                 2140   ;
                 2141   ;                    OUT8243
                 2142   ;
                 2143   ;**********************************************
                 2144   ;
                 2145   ;              8243 OUTPUT SUBROUTINE
                 2146   ;
                 2147   ;ACCUMULATOR BYTE TRANSFERS THE CHIP ADDRESS LOCATION,THE
                 2148   ;DESIRED PORT ADDRESS AND THE DESIRED OPERATION ON THAT PORT.
                 2149   ;REGISTER R3 WILL CONTAIN THE DATA TO BE OUTPUT.
                 2150   ;
                 2151   #CYCLES = 16
                 2152   ;
0CD9 C2AF        2153   OUT8243:      CLR    EA
0CDB D297        2154                 SETB   P1.7           ;SET PROG HIGH
0CDD 00          2155                 NOP
0CDE E590        2156                 MOV    P1,A           ;OUT THE SETUP ADDRESS
0CE0 00          2157                 NOP
0CE1 00          2158                 NOP
0CE2 C297        2159                 CLR    P1.7           ;SET PROG LOW
```

AUTOMATIC TRANSFER SWITCH CONTROLLER.

```
LOC  OBJ       LINE  SOURCE 2160
               2161         NOP
0CE4 00        2162         ANL   A,#01110000B    ;CLEAR P20-P23
0CE5 5470      2163                               ;KEEP PROG LOW
               2164                               ;BUT LEAVE THE
               2165                               ;DECODER ADDRESS
0CE7 4B        2166         ORL   A,R3            ;OUTPUT THE DATA
0CE8 F590      2167         MOV   P1,A
0CEA 00        2168         NOP
0CEB 00        2169         NOP                   ;WAIT FOR DATA
               2170                               ;TO STABILIZE
0CEC 00        2171         NOP
0CED D297      2172         SETB  P1.7            ;SET THE PROG LINE HIGH
0CEF D2AF      2173         SETB  EA
0CF1 22        2174         RET
               2175
               2176 +1 $EJECT
```

THE FOLLOWING PAGE IS APPENDIX PAGE B1

```
AUTOMATIC TRANSFER SWITCH CONTROLLER,

LOC  OBJ        LINE    SOURCE
                                ;*********************************************************
                         23     ;
                         24     ;            ---BIT STATEMENTS---
                         25     ;
                         26     ;
                         27             BSEG    AT      0H
                         28     ;
0000                     29     RAMFLG:         DBIT    1
0001                     30     ROMFLG:         DBIT    1
0002                     31     EEPROMFLG:      DBIT    1       ;               POWRUP/MODULE
0003                     32     OUT_OF_RANGE:   DBIT    1       ;               MAIN/MODULE
0004                     33     OPTION_SELECTION: DBIT  1       ;          \
                         34     PHASE_LOSS_DIS_1: DBIT  1       ;           \
                         35     PHASE_LOSS_DIS_2: DBIT  1       ;— ERROR_BYTE
                         36     SETPOINT_FLAG:  DBIT    1       ;           /
                         37     ;                                          /
                         38     ;
                         39     SORCEAVAIL2:    DBIT    8H
                         40     SORCEAVAIL1:    DBIT    9H
                         41     TIE_LED:        DBIT    0AH
                         42     MAIN2_LED:      DBIT    0BH     ;— LEDS          DISP/MODULE
                         43     MAIN1_LED:      DBIT    0CH
                         44     KEY_SW_LED:     DBIT    0DH
                         45     ;
                         46     ;
                         47     ;
                         48     ADJ_DWN_BIT:    DBIT    10H
                         49     ADJ_UP_BIT:     DBIT    11H
                         50     STEP_BIT:       DBIT    12H
                         51     KEY_SW_BIT:     DBIT    13H     ;— PB_FLAGS      DISP/MODULE
                         52     L_O_RESET_BIT:  DBIT    14H
                         53     DEADMAN:        DBIT    15H
                         54     DISPLAY_BIT:    DBIT    16H
                         55     CYCLE:          DBIT    17H
                         56     ;
                         57     TIMER_START:    DBIT    18H
                         58     PE1:            DBIT    19H
                         59     PE2:            DBIT    1AH
                         60     GEN_START:      DBIT    1BH
                         61     GEN_P0:         DBIT    1CH     ;— GENERATOR_FLGS  MAIN/MODULE
                         62     GEN_P1:         DBIT    1DH
                         63     GEN_P2:         DBIT    1EH
                         64     GEN_P3:         DBIT    1FH
                         65     ;
                         66     P_RB1:          DBIT    20H
                         67     P_RB2:          DBIT    21H
                         68     P_AUX_1:        DBIT    22H
                         69     P_AUX_2:        DBIT    23H
                         70     P_AUTO:         DBIT    24H     ;— P_MAIN_INPUT_FLGS
                         71     P_MANUAL:       DBIT    25H
                         72     P_OFF:          DBIT    26H
                         73     P_JUMPER:3:     DBIT    27H
                         74     ;
                         75     P_LATCH_RB:     DBIT    28H
                         76     P_SELECTION:    DBIT    29H
                         77     P_UNUSED2:      DBIT    2AH
```

AUTOMATIC TRANSFER SWITCH CONTROLLER,

| LOC. OBJ | LINE | SOURCE | | | |
|---|---|---|---|---|---|
| | 78 | ; | P_UNUSED1: | DBIT | 2BH |
| | 79 | ; | P_L_O_R: | DBIT | 2CH |
| | 80 | ; | P_GEN_START_IN: | DBIT | 2DH |
| | 81 | ; | P_G_F_O_C: | DBIT | 2EH |
| | 82 | ; | P_GEN_STOP_BIT: | DBIT | 2FH = P_MORE_MAIN_FLGS |
| | 83 | ; | | | |
| | 84 | ; | P_CLOSE1: | DBIT | 30H |
| | 85 | ; | P_CLOSE2: | DBIT | 31H |
| | 86 | ; | P_CLOSE_TIE_IN: | DBIT | 32H |
| | 87 | ; | P_RB_TIE: | DBIT | 33H |
| | 88 | ; | P_OPTION: | DBIT | 34H |
| | 89 | ; | P_TRIP1: | DBIT | 35H |
| | 90 | ; | P_TRIP2: | DBIT | 36H |
| | 91 | ; | P_TIE_TRIP_IN: | DBIT | 37H = P_OPTION_IN_FLGS |
| | 92 | ; | | | |
| | 93 | ; | RB1: | DBIT | 38H |
| | 94 | ; | RB2: | DBIT | 39H |
| | 95 | ; | AUX_1: | DBIT | 3AH |
| | 96 | ; | AUX_2: | DBIT | 3BH |
| | 97 | ; | AUTO: | DBIT | 3CH |
| | 98 | ; | MANUAL: | DBIT | 3DH = MAIN_INPUT_FLGS    MAIN/MODULE |
| | 99 | ; | OFF: | DBIT | 3EH |
| | 100 | ; | JUMPER3: | DBIT | 3FH |
| | 101 | ; | LATCH_RB: | DBIT | 40H |
| | 102 | ; | SELECTION: | DBIT | 41H |
| | 103 | ; | UNUSED2: | DBIT | 42H |
| | 104 | ; | UNUSED1: | DBIT | 43H |
| | 105 | ; | L_O_R: | DBIT | 44H |
| | 106 | ; | GEN_START_IN: | DBIT | 45H |
| | 107 | ; | G_F_O_C: | DBIT | 46H |
| | 108 | ; | GEN_STOP_BIT: | DBIT | 47H = MORE_MAIN_FLGS    MAIN/MODULE |
| | 109 | ; | | | |
| | 110 | ; | CLOSE1: | DBIT | 48H |
| | 111 | ; | CLOSE2: | DBIT | 49H |
| | 112 | ; | CLOSE_TIE_IN: | DBIT | 4AH |
| | 113 | ; | RB_TIE: | DBIT | 4BH |
| | 114 | ; | OPTION: | DBIT | 4CH |
| | 115 | ; | TRIP1: | DBIT | 4DH |
| | 116 | ; | TRIP2: | DBIT | 4EH |
| | 117 | ; | TIE_TRIP_IN: | DBIT | 4FH = OPTION_IN_FLGS    MAIN/MODULE |
| | 118 | ; | | | |
| | 119 | ; | | | |
| | 120 | ; | P_SPARE_IN: | DBIT | 50H |
| | 121 | ; | P_JUMPER2: | DBIT | 51H |
| | 122 | ; | P_UNUSED4: | DBIT | 52H |
| | 123 | ; | P_UNUSED3: | DBIT | 53H |
| | 124 | ; | SPARE_IN: | DBIT | 54H |
| | 125 | ; | JUMPER2: | DBIT | 55H |
| | 126 | ; | UNUSED4: | DBIT | 56H |
| | 127 | ; | UNUSED3: | DBIT | 57H = OPTION_OUT_FLGS    MAIN/MODULE |
| | 128 | ; | | | |
| | 129 | ; | | | |
| | 130 +1 | $EJECT | | | |

AUTOMATIC TRANSFER SWITCH CONTROLLER,

| LOC OBJ | LINE | SOURCE | | | |
|---|---|---|---|---|---|
| | 185 | ;****************************************************************** | | | |
| | 186 | ; | | | |
| | 187 | ; -------- SEGMENTS --------- | | | |
| | 188 | ; | | | |
| | 189 | ; POWERUP_CODE SEGMENT CODE UNIT | | | |
| | 190 | ; | | | |
| | 191 | ;****************************************************************** | | | |
| | 192 | ; | | | |
| | 193 | ; | | | |
| | 194 | ; | | | |
| | 195 | ; EQUATE STATEMENTS | | | |
| 0011 | 196 | TEMP_REGISTER | DATA | 10H | |
| 0012 | 197 | CHIP_SELECT | DATA | 11H | |
| | 198 | DIGIT | DATA | 12H | |
| | 199 | INC_DEC_DATA | DATA | 13H | |
| | 200 | MILLI_SECOND | DATA | 14H | |
| 0015 | 201 | H2_LOW_BYTE | DATA | 15H | |
| 0016 | 202 | H2_NIBBLE | DATA | 16H | |
| 0017 | 203 | SOURCE1_CNT | DATA | 17H | |
| 0018 | 204 | SOURCE2_CNT | DATA | 18H | |
| | 205 | BIN_LOW_BYTE | DATA | 19H | |
| | 206 | BIN_HIGH_BYTE | DATA | 1AH | |
| | 207 | SECOND | DATA | 1BH | |
| 001C | 208 | G_EX_TIME_OUT | DATA | 1CH | |
| | 209 | BIT_COUNT | DATA | 1DH | |
| | 210 | BUF_COUNT | DATA | 1EH | |
| 001F | 211 | DEADMAN_CNT | DATA | 1FH | |
| 0020 | 212 | ERROR_BYTE | DATA | 20H | |
| 0021 | 213 | LEDS | DATA | 21H | |
| | 214 | PB_FLAGS | DATA | 22H | PROG |
| | 215 | GENERATOR_FLGS | DATA | 23H | MAIN |
| | 216 | P_MAIN_INPUT_FLGS | DATA | 24H | CKINTR |
| | 217 | P_MORE_MAIN_FLGS | DATA | 25H | CKINTR |
| | 218 | P_OPTION_IN_FLGS | DATA | 26H | CKINTR |
| | 219 | MAIN_INPUT_FLGS | DATA | 27H | MAIN |
| | 220 | MORE_MAIN_FLGS | DATA | 28H | MAIN |
| | 221 | OPTION_IN_FLGS | DATA | 29H | MAIN |
| | 222 | OPTION_OUT_FLGS | DATA | 2AH | MAIN |
| | 223 | INTR_FLGS | DATA | 2BH | MAIN |
| | 224 | TIME_DELAY_BYTE | DATA | 2CH | MAIN |
| 002D | 225 | TEST_RAM_BYTE | DATA | 2DH | |
| 002E | 226 | MORE_SP_FLGS | DATA | 2EH | |
| 002F | 227 | SETPOINT_FLGS | DATA | 2FH | |
| 0030 | 228 | BFREQ | DATA | 30H | |
| 0031 | 229 | BVOLTS_H | DATA | 31H | |
| 0032 | 230 | BVOLTS_L | DATA | 32H | |
| 0033 | 231 | UV_DROP1 | DATA | 33H | |
| 0034 | 232 | UV_DROP2 | DATA | 34H | |
| 0035 | 233 | UV_PICK1 | DATA | 35H | |
| 0036 | 234 | UV_PICK2 | DATA | 36H | |
| 0037 | 235 | OV_DROP1 | DATA | 37H | |
| 0038 | 236 | OV_DROP2 | DATA | 38H | |
| 0039 | 237 | OV_PICK1 | DATA | 39H | |
| 003A | 238 | OV_PICK2 | DATA | 3AH | |
| 003B | 239 | NE_TRAN_S | DATA | 3BH | |

AUTOMATIC TRANSFER SWITCH CONTROLLER,

| LOC OBJ | LINE | SOURCE | | | |
|---|---|---|---|---|---|
| 003C | 240 | | NE_TRAN_M | DATA | 3CH |
| 003D | 241 | | EN_TRAN_S | DATA | 3DH |
| 003E | 242 | | EN_TRAN_M | DATA | 3EH |
| 003F | 243 | | NEUTRAL | DATA | 3FH |
| 0040 | 244 | | UNDR_HZ1 | DATA | 40H |
| 0041 | 245 | | OVER_HZ1 | DATA | 41H |
| 0042 | 246 | | UNDER_HZ2 | DATA | 42H |
| 0043 | 247 | | OVER_HZ2 | DATA | 43H |
| 0044 | 248 | | GENDELAY | DATA | 44H |
| 0045 | 249 | | COOLDWN | DATA | 45H |
| 0046 | 250 | | DAY | DATA | 46H |
| 0047 | 251 | | HOUR | DATA | 47H |
| 0048 | 252 | | MIN | DATA | 48H |
| 0049 | 253 | | G_RUN_TIME | DATA | 49H |
| 004A | 254 | | G_EXOR_DAY | DATA | 4AH |
| 004B | 255 | | G_EXOR_HR | DATA | 4BH |
| 004C | 256 | | PREFER | DATA | 4CH |
| 004D | 257 | | BREAKERS | DATA | 4DH |
| 004E | 258 | | SETPOINT_CK_SUM | DATA | 4EH |
| | 259 | ; | RANGE | DATA | 4FH | PROG |
| | 260 | ; | HUND | DATA | 50H | PROG |
| | 261 | ; | TENS | DATA | 51H | PROG |
| | 262 | ; | ONES | DATA | 52H | PROG |
| | 263 | ; | BLANK_MIN | DATA | 53H | PROG |
| | 264 | ; | TENS_MIN | DATA | 54H | PROG |
| | 265 | ; | ONES_MIN | DATA | 55H | PROG |
| | 266 | ; | -STACK- | DATA | 56H | |
| | 267 | ; | | DATA | 57H | |
| | 268 | ; | | DATA | 58H | |
| | 269 | ; | | DATA | 59H | |
| | 270 | ; | | DATA | 5AH | |
| | 271 | ; | | DATA | 5BH | |
| | 272 | ; | | DATA | 5CH | |
| | 273 | ; | | DATA | 5DH | |
| | 274 | ; | | DATA | 5EH | |
| | 275 | ; | | DATA | 5FH | |
| | 276 | ; | | DATA | 60H | |
| | 277 | ; | | DATA | 61H | |
| | 278 | ; | | DATA | 62H | |
| | 279 | ; | | DATA | 63H | |
| | 280 | ; | | DATA | 64H | |
| | 281 | ; | | DATA | 65H | |
| | 282 | ; | | DATA | 66H | |
| | 283 | ; | | DATA | 67H | |
| | 284 | ; | | DATA | 68H | |
| | 285 | ; | | DATA | 69H | |
| | 286 | ; | | DATA | 6AH | |
| | 287 | ; | | DATA | 6BH | |
| | 288 | ; | | DATA | 6CH | |
| | 289 | ; | | DATA | 6DH | |
| | 290 | ; | | DATA | 6EH | |
| | 291 | ; | | DATA | 6FH | |
| | 292 | ; | V1_UV_DROP | DATA | 70H | MAIN |
| | 293 | ; | V1_UV_PICK | DATA | 71H | MAIN |
| | 294 | ; | V2_UV_DROP | DATA | 72H | MAIN |

AUTOMATIC TRANSFER SWITCH CONTROLLER,

| LOC OBJ | LINE | SOURCE | | | |
|---|---|---|---|---|---|
| | 295 | ; | V2_UV_PICK | DATA | 73H | MAIN |
| | 296 | ; | V1_OV_DROP | DATA | 74H | MAIN |
| | 297 | ; | V1_OV_PICK | DATA | 75H | MAIN |
| | 298 | ; | V2_OV_DROP | DATA | 76H | MAIN |
| | 299 | ; | V2_OV_PICK | DATA | 77H | MAIN |
| | 300 | ; | TIME_OUT_DELAY_M | DATA | 78H | MAIN |
| | 301 | ; | TIME_OUT_DELAY_S | DATA | 79H | MAIN |
| | 302 | ; | KEY_SWITCH | DATA | 7AH | MAIN |
| | 303 | ; | STEP_PB | DATA | 7BH | MAIN |
| | 304 | ; | CYCLE_COUNTER | DATA | 7CH | MAIN |
| | 305 | ; | ADJ_UP | DATA | 7DH | MAIN |
| | 306 | ; | ADJ_DOWN | DATA | 7EH | HERTZ |
| | 307 | ; | L_O_RESET | DATA | 7FH | HERTZ |
| | 308 | ; | | | | |
| 1010 | 309 | ; | XSETPOINT1 | XDATA | 1010H | |
| 1040 | 310 | ; | XSETPOINT2 | XDATA | 1040H | |
| 1070 | 311 | ; | XSETPOINT3 | XDATA | 1070H | |
| | 312 | ; | | | | |
| 1100 | 313 | ; | XCLK_ADDRESS | XDATA | 1100H | |
| | 314 | ; | | | | |
| | 315 | ; | | | | |
| | 316 | ;******* DUAL RAM LABLE LOCATION ASSIGNMENTS ******* |
| | 317 | ; | | | | |
| | 318 | ; | | | | |
| 0030 | 319 | | PHASE_SELECT | EQU | BFREQ | |
| 0032 | 320 | | VOLTS_1 | EQU | BVOLTS_L | |
| 0031 | 321 | | V1_LOW_BYTE | EQU | BVOLTS_H | |
| 0033 | 322 | | V1_NIBBLE | EQU | UV_DROP1 | |
| 0034 | 323 | | VOLTS_2 | EQU | UV_PICK1 | |
| 0035 | 324 | | V2_LOW_BYTE | EQU | UV_DROP2 | |
| 0036 | 325 | | V2_NIBBLE | EQU | UV_PICK2 | |
| 0037 | 326 | | HERTZ_1 | EQU | OV_DROP1 | |
| 0038 | 327 | | HERTZ_2 | EQU | OV_PICK1 | |
| 0039 | 328 | | H1_LOW_BYTE | EQU | OV_DROP2 | |
| 003A | 329 | | H1_NIBBLE | EQU | OV_PICK2 | |
| | 330 | ; | | | | |
| | 331 | ; | | | | |
| | 332 | ;************ EXTERNAL STATEMENTS ************ |
| | 333 | ; | | | | |
| | 334 | ; | | | | |
| | 335 | ; | | | | |
| | 336 | ; | | | | |
| | 337 | | EXTRN | CODE( INTERNAL_LOOP) | | |
| | 338 | | EXTRN | CODE( DISPLAY45) | | |
| | 339 | | EXTRN | CODE( DISPLAY50) | | |
| | 340 | | EXTRN | CODE( DISPLAY78) | | |
| | 341 | | EXTRN | CODE( DISPLAY) | | |
| | 342 | ; | | | | |
| | 343 | | EXTRN | CODE( CKSUMH) | | |
| | 344 | | EXTRN | CODE( CKSUML) | | |
| | 345 | | EXTRN | CODE( LASTBY) | | |
| | 346 | ; | | | | |
| | 347 | | EXTRN | CODE( CLOCK_INTERRUPT) | | |
| | 348 | | EXTRN | CODE( EDGE_INTR) | | |
| | 349 | | EXTRN | CODE( OVERFLOW_INTR) | | |

```
AUTOMATIC TRANSFER SWITCH CONTROLLER,

LOC  OBJ    LINE   SOURCE
            455   ;**************************************************************
            456   ;
            457   ;                 RAM MAP IS AS FOLLOWS:
            458   ;
            459   ;   ,0           R0                43-H   INTR_FLGS
            460   ;   ,1           R1                44-H   TIME_DELAY_BYTE
            461   ;   ,2           R2                45-PO  TEST_RAM_BYTE
            462   ;   ,3           R3                46-PO  MORE_SP_FLGS
            463   ;   ,4           R4                47-PO  SETPOINT_FLGS
            464   ;   ,5           R5                48-PO  BFREQ    PHASE_SELECT
            465   ;   ,6           R6                49-PO  BVOLTS_H V1_LOW_BYTE
            466   ;   ,7           R7                50-PO  BVOLTS_L V1_NIBBLE
            467   ;   ,8           INTR_REG_BANK     51-PO  UV_DROP1 VOLTS_1
            468   ;   ,9           R1                52-PO  UV_PICK1 VOLTS_2
            469   ;   ,10          R2                53-PO  UV_DROP2 V2_LOW_BYTE
            470   ;   ,11          R3                54-PO  UV_PICK2 V2_NIBBLE
            471   ;   ,12          R4                55-PO  OV_DROP1 HERTZ_1
            472   ;   ,13          R5                56-PO  OV_PICK1 HERTZ_2
            473   ;   ,14          R6                57-PO  OV_DROP2 H1_LOW_BYTE
            474   ;   ,15          R7                58-PO  OV_PICK2 H1_NIBBLE
            475   ;   ,16-H        TEMP_REGISTER     59-PO  NE_TRAN_S
            476   ;   ,17-PO       CHIP_SELECT       60-PO  NE_TRAN_M
            477   ;   ,18-PO       DIGIT             61-PO  EN_TRAN_S
            478   ;   ,19-PR       INC_DEC_DATA      62-PO  EN_TRAN_M
            479   ;   ,20-CX       MILLI_SECOND      63-PO  NEUTRAL
            480   ;   ,21-PO       H2_LOW_BYTE       64-PO  UNDER_HZ1
            481   ;   ,22-PO       H2_NIBBLE         65-PO  OVER_HZ1
            482   ;   ,23-PO       SOURCE1_CNT       66-PO  UNDER_HZ2
            483   ;   ,24-PO       SOURCE2_CNT       67-PO  OVER_HZ2
            484   ;   ,25-PR       BIN_LOW_BYTE      68-PO  GENDELAY
            485   ;   ,26-PR       BIN_HIGH_BYTE     69-PO  COOLDWN
            486   ;   ,27-CK       SECOND            70-PO  DAY
            487   ;   ,28          MIN               71-PO  HOUR
            488   ;   ,29-IN       BIT_COUNT         72-PO  MIN
            489   ;   ,30-IN       BUF_COUNT         73-PO  G_RUN_TIME
            490   ;   ,31-PO       DEADMAN_CNT       74-PO  G_EXOR_DAY
            491   ;   ,32-PO       ERROR_BYTE        75-PO  G_EXOR_HR
            492   ;   ,33-PO       LEDS              76-PO  PREFER
            493   ;   ,34-PR       PB_FLAGS          77-PO  BREAKERS
            494   ;   ,35-H        GENERATOR_FLGS    78-PQ  SETPOINT_CK_SUM
            495   ;   ,36-H        P_MAIN_INPUT_FLGS 79-PR  RANGE
            496   ;   ,37-H        P_MORE_MAIN_FLGS  80-PR  HUND
            497   ;   ,38-H        P_OPTION_IN_FLGS  81-PR  TENS
            498   ;   ,39-H        MAIN_INPUT_FLGS   82-PR  ONES
            499   ;   ,40-H        MORE_MAIN_FLGS    83-PR  BLANK_MIN
            500   ;   ,41-H        OPTION_IN_FLGS    84-PR  TENS_MIN
            501   ;   ,42-H        OPTION_OUT_FLGS   85-PR  ONES_MIN
            502   ;**************************************************************
            503   $EJECT
```

| | | |
|---|---|---|
| 86 | | STACK |
| 87 | | |
| 88 | | |
| 89 | | |
| 90 | | |
| 91 | | |
| 92 | | |
| 93 | | |
| 94 | | |
| 95 | | |
| 96 | | |
| 97 | | |
| 98 | | |
| 99 | | |
| 100 | | |
| 101 | | |
| 102 | | |
| 103 | | |
| 104 | | |
| 105 | | |
| 106 | | |
| 107 | | |
| 108 | | |
| 109 | | |
| 110 | | |
| 111 | | |
| 112-H | V1_UV_DROP | |
| 113-H | V1_UV_PICK | |
| 114-H | V2_UV_DROP | |
| 115-H | V2_UV_PICK | |
| 116-H | V1_OV_DROP | |
| 117-H | V1_OV_PICK | |
| 118-H | V2_OV_DROP | |
| 119-H | V2_OV_PICK | |
| 120-H | TIME_OUT_DELAY_M | |
| 121-H | TIME_OUT_DELAY_S | |
| 122-PR | KEY_SWITCH | |
| 123-PR | STEP_PB | |
| 124-H | CYCLE_COUNTER | |
| 125-PR | ADJ_UP | |
| 126-PR | ADJ_DOWN | |
| 127-PR | L_O_RESET | |

I claim:

1. In a computer system operative to provide control signals in response to a plurality of input signals selectively interrogated, each interrogated input signal normally representing an AC power voltage of fundamental frequency in the form of a first train of pulses of equal width having successive high and low digital levels at the frequency and phase of said AC power voltage; the combination of:

means responsive to said AC power voltage for generating a reference signal in the form of a reference train of pulses having high and low digital levels of the same width as normally for said first train, at the same said frequency, and shifted therefrom by a predetermined delay;

means responsive to said first train of pulses for sampling the digital level thereof; first upon the occurrence of one of a falling and rising edge in said reference train, secondly a half-cycle thereafter; thereby to derive consecutive first and a second samples thereupon; and means for comparing said first and second samples for detecting in relation to a predetermined lack of parity between consecutive first and second samples an indication of invalidity of said interrogated input signal.

2. The computer system of claim 1 with said sampling means including a latch associated with an interrogated input signal, said latch being toggled a first time for latching upon the occurence of a falling edge in said reference train, and said latch being toggled a second time situated after said delay and before the occurrence of the rising edge following said falling edge in said reference train, said first sample being derived by said latch from said interrogated input signal on said first time and said second sample being derived by said latch from said interrogated input signal on said second time.

3. The computer system of claim 2 with said comparing means digitally comparing said first and second samples in relation to each interrogated input signal, said first and second samples having a succession of opposite logic levels as an indication of a valid input signal.

4. The computer system of claim 3 being associated with a motor drive controlling an AC motor supplied with said AC power voltage from a line voltage at the fundamental frequency; said plurality of interrogated input signals being passed through respective contact means corresponding each to a particular command for operation of the motor, said computer system handling an interrogated input signal to generate a corresponding control signal in accordance with said validity test, whereby the motor is controlled in relation to such input signal and in accordance with the true state of the associated contact means.

5. The computer system of claim 3 associated with an automatic transfer switch operating with said AC power voltage as derived from a line voltage at said fundamental frequency;

said plurality of interrogated input signals having respective contact means corresponding each to a particular command for operation of said automatic transfer switch, said computer system handling an interrogated input signal to generate a corresponding said control signal in accordance with a lack of parity being detected by said comparing means, whereby the automatic transfer switch is controlled in relation to such input signal and in accordance with the true state of the associated contact means.

* * * * *